United States Patent
Eom et al.

(10) Patent No.: US 11,935,926 B2
(45) Date of Patent: Mar. 19, 2024

(54) SEMICONDUCTOR DEVICE AND METHOD FOR FABRICATING THE SAME

(71) Applicant: SK hynix Inc., Icheon (KR)

(72) Inventors: Hyeng-Woo Eom, Incheon (KR);
Jung-Myoung Shim, Icheon (KR);
Young-Ho Yang, Cheongju (KR);
Kwang-Wook Lee, Hwaseong (KR);
Won-Joon Choi, Seoul (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 18/156,355

(22) Filed: Jan. 18, 2023

(65) Prior Publication Data
US 2023/0163176 A1    May 25, 2023

Related U.S. Application Data

(63) Continuation of application No. 16/741,138, filed on Jan. 13, 2020.

(30) Foreign Application Priority Data

Jun. 10, 2019 (KR) .................. 10-2019-0067994

(51) Int. Cl.
*H01L 21/28* (2006.01)
*H01L 21/02* (2006.01)
(Continued)

(52) U.S. Cl.
CPC .... *H01L 29/40117* (2019.08); *H01L 21/0214* (2013.01); *H01L 21/02164* (2013.01);
(Continued)

(58) Field of Classification Search
CPC ......... H01L 27/11582; H01L 27/11524; H01L 27/11551; H01L 27/11568; H01L 27/11578; H01L 27/02362; H01L 21/76841–76876; H01L 21/02362; H01L 21/0214; H01L 21/02244; H01L 21/02186; H01L 21/28568; H01L 21/32051; H01L 23/53223; H01L 23/53238; H01L 23/53266; H01L 23/53252; H01L 2221/1073–1089; H01L 29/401; G11C 2213/51; G11C 2213/54
See application file for complete search history.

(56) References Cited

U.S. PATENT DOCUMENTS 9,397,046 B1    7/2016  Sharangpani et al.
9,484,353 B1 *  11/2016 Lai ................... H01L 29/40114
(Continued)

FOREIGN PATENT DOCUMENTS

| CN | 101188187 A | 5/2008 |
| CN | 102077356 A | 5/2011 |

(Continued)

*Primary Examiner* — Dale E Page
*Assistant Examiner* — Lawrence C Tynes, Jr.

(57) ABSTRACT

A method for fabricating a semiconductor device includes forming a stack structure including a horizontal recess over a substrate, forming a blocking layer lining the horizontal recess, forming an interface control layer including a dielectric barrier element and a conductive barrier element over the blocking layer, and forming a conductive layer over the interface control layer to fill the horizontal recess.

17 Claims, 25 Drawing Sheets

(51) Int. Cl.
*H01L 21/285* (2006.01)
*H01L 21/3205* (2006.01)
*H01L 29/51* (2006.01)
*H10B 43/27* (2023.01)

(52) U.S. Cl.
CPC .. *H01L 21/02186* (2013.01); *H01L 21/02244* (2013.01); *H01L 21/28568* (2013.01); *H01L 21/32051* (2013.01); *H01L 29/513* (2013.01); *H10B 43/27* (2023.02); *H01L 21/02178* (2013.01)

(56) References Cited

U.S. PATENT DOCUMENTS

| | | | |
|---|---|---|---|
| 2009/0053538 A1* | 2/2009 | Ma | H01L 21/76805 428/457 |
| 2010/0244153 A1 | 9/2010 | Hsu et al. | |
| 2015/0255329 A1* | 9/2015 | Ren | H01L 21/02266 438/643 |
| 2017/0373079 A1* | 12/2017 | Sharangpani | H01L 27/11524 |
| 2018/0331117 A1 | 11/2018 | Titus et al. | |

FOREIGN PATENT DOCUMENTS

| | | | | |
|---|---|---|---|---|
| CN | 104752360 A | | 7/2015 | |
| CN | 109417025 A | | 3/2019 | |
| CN | 109585448 A | | 4/2019 | |
| JP | 2000100753 A | | 4/2000 | |
| KR | 20150027408 A | * | 3/2015 | ......... H01L 29/7926 |
| KR | 20190009401 A | * | 1/2019 | ......... H01L 27/1052 |

* cited by examiner

SEMICONDUCTOR DEVICE AND METHOD FOR FABRICATING THE SAME

CROSS-REFERENCE TO RELATED APPLICATIONS

The present application is a continuation application of U.S. application Ser. No. 16/741,138 filed Jan. 13, 2020, and claims priority of Korean Patent Application No. 10-2019-0067994, filed on Jun. 10, 2019, which is incorporated herein by reference in its entirety.

BACKGROUND

1. Field

Exemplary embodiments of the present disclosure relate to a method for fabricating a semiconductor device, and more particularly, to a vertical semiconductor device and a method for fabricating the semiconductor device.

2. Description of the Related Art

Vertical semiconductor devices including memory cells that are vertically arranged in three dimensions have been proposed to increase the degree of integration of semiconductor devices.

SUMMARY

Embodiments of the present disclosure are directed to a vertical semiconductor device capable of preventing interaction between a conductive material and a dielectric material, and a method of fabricating the vertical semiconductor device.

In accordance with an embodiment, a method for fabricating a semiconductor device includes: forming a stack structure including a horizontal recess over a substrate; forming a blocking layer lining the horizontal recess; forming an interface control layer including a dielectric barrier element and a conductive barrier element over the blocking layer; and forming a conductive layer over the interface control layer to fill the horizontal recess.

In accordance with another embodiment, a semiconductor device includes: a stack structure including a plurality of horizontal recesses vertically spaced apart from each other; a blocking layer lining the horizontal recess; and a gate structure provided within the horizontal recess and covers the blocking layer, wherein the gate structure includes: an interface control layer that covers the blocking layer, the interface control layer including a conductive barrier element and a dielectric barrier element; and a gate electrode filled within the horizontal recess and over the interface control layer.

DETAILED DESCRIPTION

Figure 1:
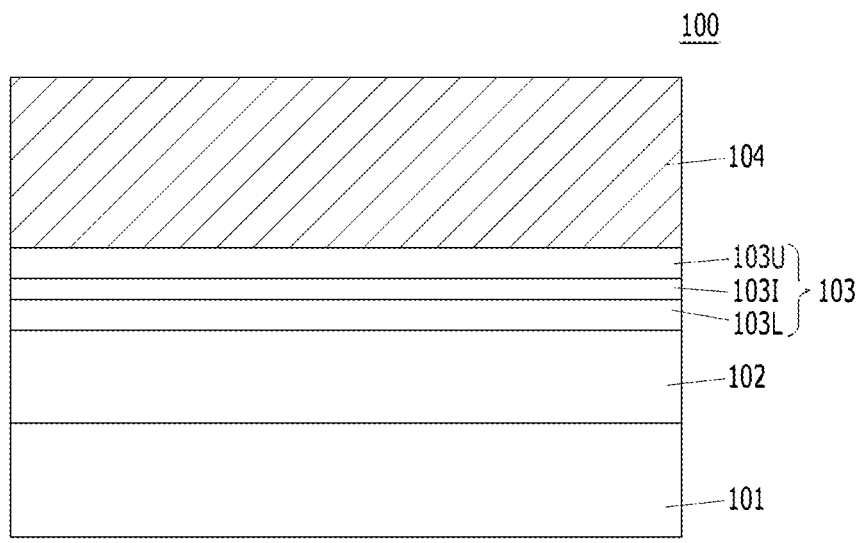
FIG. 1 is a cross-sectional view illustrating a semiconductor device in accordance with an embodiment of the present disclosure.

Exemplary embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments described in this patent specification will be described with reference to cross-sectional, plan and block diagrams, which are ideal schematic diagrams of the present disclosure. Accordingly, shapes of the exemplary views may be modified according to the fabrication techniques and/or tolerances. Accordingly, the following embodiments of the present disclosure are not limited to the particular forms shown in the accompanying drawings, but may include variations in forms generated by the fabrication process. Thus, the regions illustrated in the figures have schematic attributes, and the shapes of the regions illustrated in the figures are intended to illustrate particular forms of regions of a device, and are not intended to limit the scope of the present disclosure.

The following embodiments show a gate structure including a gate electrode over a dielectric layer after the dielectric layer is formed. When the gate electrode is formed, it is possible to form a high-functional multi-layer (HFML) structure. The high-functional multi-layer structure may include a material that improves adhesion between the dielectric layer and the gate electrode. The high-functional multi-layer structure may include a material that may prevent an interaction between the dielectric layer and the gate electrode. The high-functional multi-layer structure may include a material capable of blocking impurities diffused from the gate electrode. The high-functional multi-layer structure may include a material that prevents a reaction between the dielectric layer and the gate electrode.

With the high-functional multi-layer structure, it is possible to form a gate structure having a high dielectric constant and fume blocking characteristics.

The high-functional multi-layer structure may be referred to as an interface control layer. The interface control layer may be a stack including titanium nitride (TiN) and titanium oxide (TiON). For example, the interface control layer may include a TOT (TiN/TiON/TiN) stack or an OT (TiON/TiN) stack.

When a single layer of TiN is formed over a recess of a high aspect ratio, the single layer of TiN may have poor step coverage. When the thickness of TiN is increased to compensate for the poor step coverage, the resistance Rs of the gate electrode may be increased by a high resistance component of TiN. When the resistance of the gate electrode is increased, a program operation rate may be slow.

As a comparative example, when a stack of a blocking layer and TiN is applied, the dielectric constant that may not be sufficient to block the back tunneling of electrons.

Embodiments of the present disclosure may provide a barrier layer that may satisfy both high dielectric constant and high work function.

FIG. 1 is a cross-sectional view illustrating a semiconductor device 100 in accordance with an embodiment of the present disclosure.

Referring to FIG. 1, the semiconductor device 100 may include a substrate 101, a dielectric layer 102 disposed over the substrate 101, and a conductive layer 104 disposed over the dielectric layer 102. The semiconductor device 100 may further include an interface control layer 103 between the conductive layer 104 and the dielectric layer 102.

The substrate 101 may be of a material suitable for semiconductor processing. The substrate 101 may include a semiconductor substrate. The substrate 101 may be formed of a silicon-containing material. For example, the substrate 101 may include silicon, monocrystalline silicon, polysilicon, amorphous silicon, silicon germanium, monocrystalline silicon germanium, polycrystalline silicon germanium, carbon-doped silicon, a combination of these materials, or multiple layers of these materials. The substrate 101 may include other semiconductor materials, such as germanium. The substrate 101 may include a III/V-group semiconductor substrate, such as a compound semiconductor substrate, e.g., GaAs. The substrate 101 may include a Silicon-On-Insulator (SOI) substrate.

The dielectric layer 102 may include silicon oxide, silicon nitride, high-k materials, or a combination thereof. The dielectric layer 102 may include a single-layered material, a multi-layered material, laminated materials, intermixing materials, or a combination thereof. A high-k material of dielectric layer 102 may have a higher dielectric constant than silicon oxide ($SiO_2$). The silicon oxide may have a dielectric constant of approximately 3.9, and the high-k material may include a material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), or a combination thereof.

The conductive layer 104 may include a low-resistance material. The conductive layer 104 may include a semiconductor material, a metal, a metal nitride, a metal silicide, or a combination thereof. In an embodiment, the conductive layer 104 may include tungsten.

A tungsten layer as the conductive layer 104 may use tungsten hexafluoride ($WF_6$) as a base material. The tungsten hexafluoride ($WF_6$) be a tungsten source gas that is used to form a tungsten layer. The tungsten layer may be deposited using a tungsten source gas and a reaction gas. The tungsten source gas may include tungsten hexafluoride gas. The reaction gas may include a hydrogen-containing gas. For example, the reaction gas may include $H_2$, $SiH_4$ or $B_2H_6$.

The interface control layer 103 may include a conductive material. The interface control layer 103 may include a material that improves adhesion between the dielectric layer 102 and the conductive layer 104. The interface control layer 103 may include a material capable of preventing interaction between the dielectric layer 102 and the conductive layer 104. The interface control layer 103 may include a material capable of blocking impurities diffused from the conductive layer 104. The interface control layer 103 may include a material capable of preventing a reaction between the dielectric layer 102 and the conductive layer 104. The interface control layer 103 may be thinner than the conductive layer 104.

The interface control layer 103 may include a metal nitride-based material. The interface control layer 103 may include a stack of metal nitride and oxygen-containing metal nitride. The oxygen-containing metal nitride may be an oxide of a metal nitride. According to another embodiment of the present disclosure, the oxygen-containing metal nitride may refer to an oxygen-doped metal nitride. The interface control layer 103 may include titanium nitride, titanium oxynitride, tantalum nitride, tantalum oxynitride, tungsten nitride, tungsten oxynitride, aluminum nitride, aluminum oxynitride, or a combination thereof. For example, the interface control layer 103 may include a titanium nitride-base material (TiN-base material). Here, the titanium nitride-base material may include titanium nitride (TiN), titanium oxynitride (TiON) or a combination thereof.

The interface control layer 103 may include a first barrier layer 103L, a second barrier layer 103U, and an interface layer 103I between the first barrier layer 103L and the second barrier layer 103U. The first barrier layer 103L may directly contact the dielectric layer 102, and the second barrier layer 103U may directly contact the conductive layer 104. The first barrier layer 103L and the second barrier layer 103U may be of the same material. The interface layer 103I may be formed of a material that is different from the materials of the first barrier layer 103L and the second barrier layer 103U. The interface layer 103I may be substantially thinner than the first barrier layer 103L and the second barrier layer 103U. The first barrier layer 103L and the second barrier layer 103U may have the same thickness or they may have different thicknesses. The first barrier layer 103L may have a thickness of approximately 3 to 20 Å, and the second barrier layer 103U may have a thickness of approximately 15 to 30 Å. The interface layer 103I may have a thickness of approximately 1 to 5 Å.

For example, the first barrier layer 103L and the second barrier layer 103U may be of titanium nitride (TiN), and the interface layer 103I may be of titanium oxynitride (TION). Here, titanium oxynitride (TION) may be an oxide of titanium nitride. Titanium oxynitride (TION) may be formed by depositing titanium nitride and then oxidizing the titanium nitride. According to another embodiment, the titanium oxynitride may be formed by implanting oxygen gas when depositing titanium nitride. Titanium oxynitride (TION) may be conductive titanium oxynitride.

The interface control layer 103 may be a TiN/TiON/TiN stack in which a titanium oxynitride layer (TION) is positioned between titanium nitride layers (TiN).

FIGS. 2A to 2D are cross-sectional views illustrating an example of a method for fabricating the semiconductor device shown in FIG. 1.

Figure 2A:
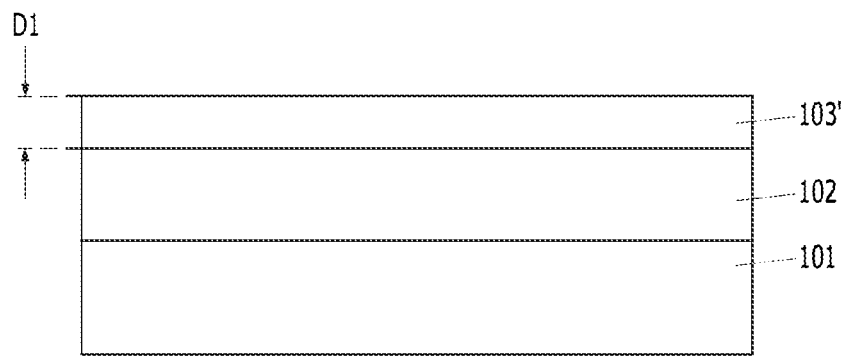
FIGS. 2A to 2D are cross-sectional views illustrating an example of a method for fabricating the semiconductor device shown in FIG. 1.

Referring to FIG. 2A, the dielectric layer 102 may be formed over the substrate 101. The dielectric layer 102 may be exposed to annealing. The dielectric layer 102 may include aluminum oxide ($Al_2O_3$). According to another embodiment of the present disclosure, the dielectric layer 102 may include a stack in which silicon nitride, silicon oxide, and aluminum oxide are sequentially stacked in that order.

An initial barrier layer 103' may be formed over the dielectric layer 102. The initial barrier layer 103' may be formed to have an initial thickness D1. The initial barrier layer 103' may include titanium nitride. The initial barrier layer 103' may be formed by an Atomic Layer Deposition (ALD) process or a Chemical Vapor Deposition (CVD) process.

Figure 2B:
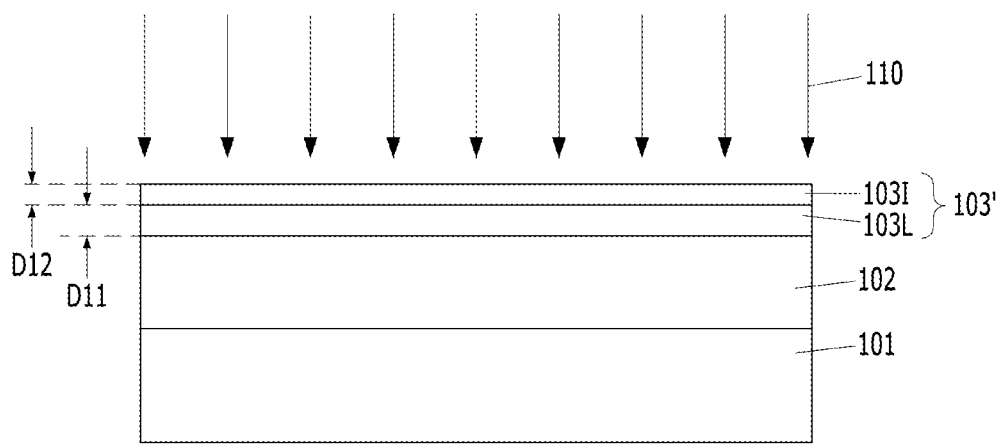

Referring to FIG. 2B, the initial barrier layer 103' may be exposed to an oxidation process 110. The oxidation process 110 may be performed in-situ in a chamber in which the initial barrier layer 103' is deposited. The oxidation process 110 may be performed while flowing oxygen ($O_2$) gas. The oxidation process 110 may also be performed while flowing NO or $NO_2$.

After the oxidation process 110, the initial barrier layer 103' may include a first barrier layer 103L and an interface layer 103I. The first barrier layer 103L may be a non-oxidized portion of the initial barrier layer 103', and the interface layer 103I may be an oxidized portion of the initial barrier layer 103'. The interface layer 103I may be formed in a surface region of the initial barrier layer 103'. In other words, the interface layer 103I may be a partial oxide of the initial barrier layer 103'. The interface layer 103I may be thinner than the first barrier layer 103L.

When the initial barrier layer 103' includes titanium nitride, the first barrier layer 103L may be titanium nitride (TiN), and the interface layer 103I may be titanium oxynitride (TiON).

According to another embodiment of the present disclosure, the oxidation process 110 may be performed ex-situ. For example, the oxidation process 110 may be performed by transferring the substrate 101 where the initial barrier layer 103' is formed to an oxidation process chamber. As such, the chamber for forming the initial barrier layer 103' and the chamber in which the oxidation process 110 is performed may be different from each other. The ex-situ oxidation process 110 may be performed in the atmosphere of an oxygen-containing gas. The oxygen-containing gas may include $O_2$, NO or $NO_2$.

According to another embodiment of the present disclosure, the oxidation process 110 may be performed ex-situ by exposing the substrate 101 where the initial barrier layer 103' is formed to the atmosphere. When exposed to the atmosphere, part of the initial barrier layer 103' may be native oxidation. The interface layer 103I may have an ultra-thin thickness of a native oxide layer.

As described above, the oxidation process 110 performed in-situ or ex-situ may be performed for approximately 1 to 6400 seconds. When the oxidation process 110 is performed, the oxygen gas or the oxygen-containing gas may flow at approximately 1 sccm to 100,000 sccm.

The first barrier layer 103L may be formed to have a first thickness D11, and the interface layer 103I may be formed to have a second thickness D12. The first thickness D11 of the first barrier layer 103L may be approximately 3 to 20 Å. The second thickness D12 of the interface layer 103I may be thinner than the first thickness D11 of the first barrier layer 103L.

Figure 2C:
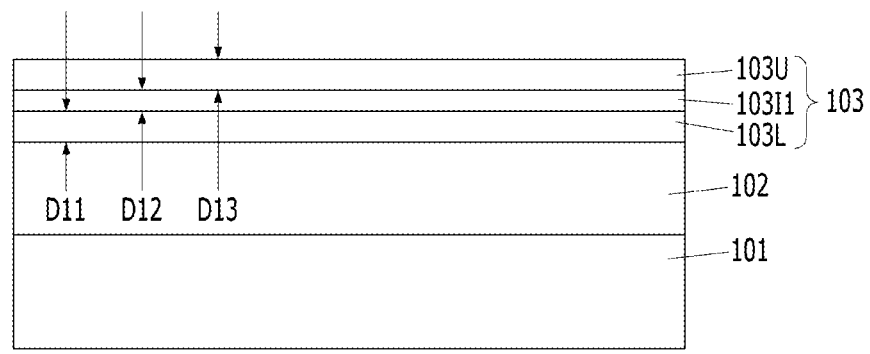

Referring to FIG. 2C, the second barrier layer 103U may be formed over the interface layer 103I. The second barrier layer 103U may be formed in-situ in the chamber in which the initial barrier layer 103' is formed. In other words, the second barrier layer 103U may be formed in-situ in the same chamber after the oxidation process 110 is performed. According to another embodiment of the present disclosure, after the oxidation process 110 is performed, the second barrier layer 103U may be formed by transferring the substrate 101 to a chamber in which the initial barrier layer 103' was formed.

In one embodiment, the initial barrier layer 103', the first barrier layer 103L, the interface layer 103U, and the second barrier layer 103U may be formed in-situ in the same chamber. In another embodiment, the initial barrier layer 103' and the second barrier layer 103U may be formed in the same chamber, and the first barrier layer 103L and the interface layer 103I may be formed ex-situ in another chamber.

The second barrier layer 103U and the first barrier layer 103L may be formed of the same material. According to another embodiment of the present disclosure, the second barrier layer 103U and the first barrier layer 103L may have different materials. The first barrier layer 103L and the second barrier layer 103U may have the same thickness or they may have different thicknesses. The second barrier layer 103U may include titanium nitride. The second barrier layer 103U may be formed by an Atomic Layer Deposition (ALD) process or a Chemical Vapor Deposition (CVD) process. The second barrier layer 103U may have a third thickness D13. The second barrier layer 103U and the initial barrier layer 103' may have the same thickness (D13=D1). The third thickness D13 of the second barrier layer 103U may be thicker than the second thickness D12 of the interface layer 103I and the first thickness D11 of the first barrier layer 103L. The second barrier layer 103U may have a thickness of approximately 15 to 30 Å.

By the series of the processes described above, the interface control layer 103 may be formed, and the interface control layer 103 may include the first barrier layer 103L, the second barrier layer 103U, and the interface layer 103I. The interface control layer 103 may be a stack where the first barrier layer 103L, the interface layer 103I, and the second barrier layer 103U are sequentially stacked in that order. The first barrier layer 103L and the second barrier layer 103U may include titanium nitride, and the interface control layer 103I may include titanium oxynitride (TiON). Accordingly, the interface control layer 103 may include a TiN/TiON/TiN stack in which titanium oxynitride is positioned between titanium nitride layers.

Figure 2D:
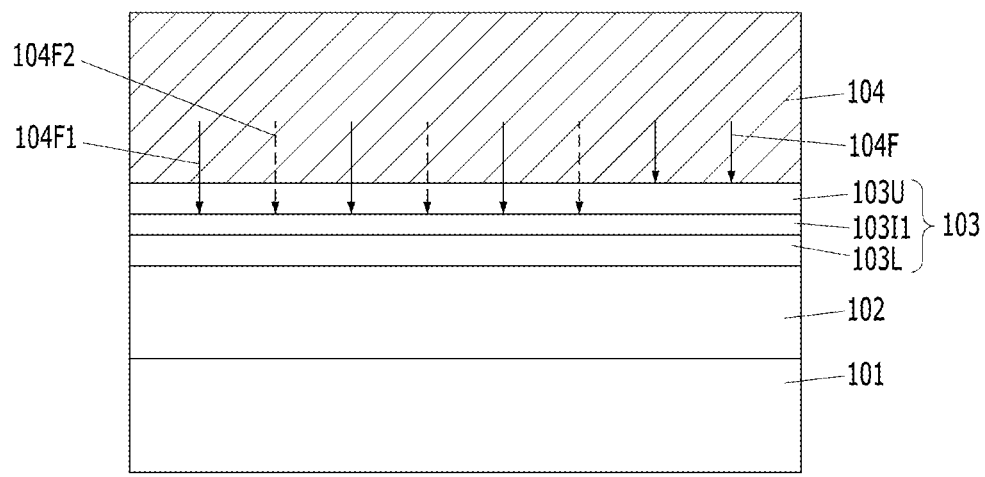

Referring to FIG. 2D, the conductive layer 104 may be formed over the second barrier layer 103U. The conductive layer 104 may include tungsten. A tungsten layer as the conductive layer 104 may use tungsten hexafluoride ($WF_6$) as a base material. The tungsten hexafluoride ($WF_6$) be a tungsten source gas that is used to form a tungsten layer. The tungsten layer may be deposited using a tungsten source gas and a reaction gas. The tungsten source gas may include tungsten hexafluoride gas. The reaction gas may include a hydrogen-containing gas. For example, the reaction gas may include $H_2$, $SiH_4$ or $B_2H_6$.

During the deposition of the conductive layer 104, impurities may diffuse into the dielectric layer 102. For example, when the conductive layer 104 includes a tungsten layer, fluorine 104F decomposed from $WF_6$ may be diffused into the dielectric layer 102 in a conventional process. In an embodiment of the present disclosure, the diffusion of the fluorine 104F may be blocked by the interface control layer 103.

Some of the fluorine 104F may be diffused along a grain boundary of the second barrier layer 103U. In this embodiment of the present disclosure, the fluorine 104F1 diffused by the interface layer 1031 of the interface control layer 103 may be blocked. Thus, the fluorine 104F1 may be prevented from diffusing into the first barrier layer 103L and the dielectric layer 102.

Also, hydrogen fluoride (HF) gas may be generated as a reaction by-product of $WF_6/H_2$ during the deposition of the tungsten layer, and the hydrogen fluoride (HF) gas may be referred to as gas fume 104F2. The gas fumes 104F2 may cause defects in the dielectric layer 102 through a subsequent thermal process. In an embodiment, the diffusion of gas fume 104F2 may be blocked by the interface layer 1031 of the interface control layer 103. Thus, the interface layer 1031 may protect the first barrier layer 103L and the dielectric layer 102 from be damaged by the gas fumes 104F2.

Figure 3A:
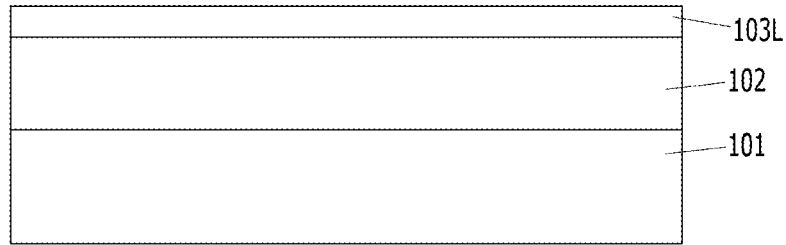
FIGS. 3A to 3C are cross-sectional views illustrating another example of the method for fabricating the semiconductor device shown in FIG. 1.
Figure 3B:
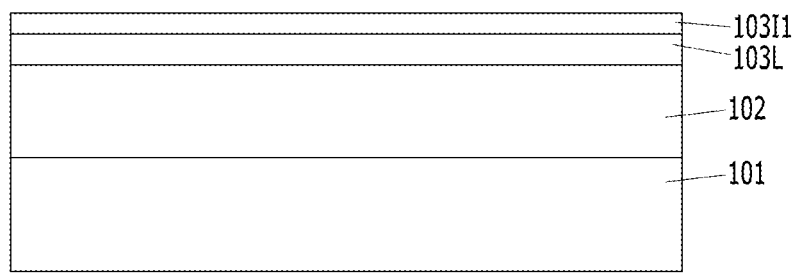
Figure 3C:
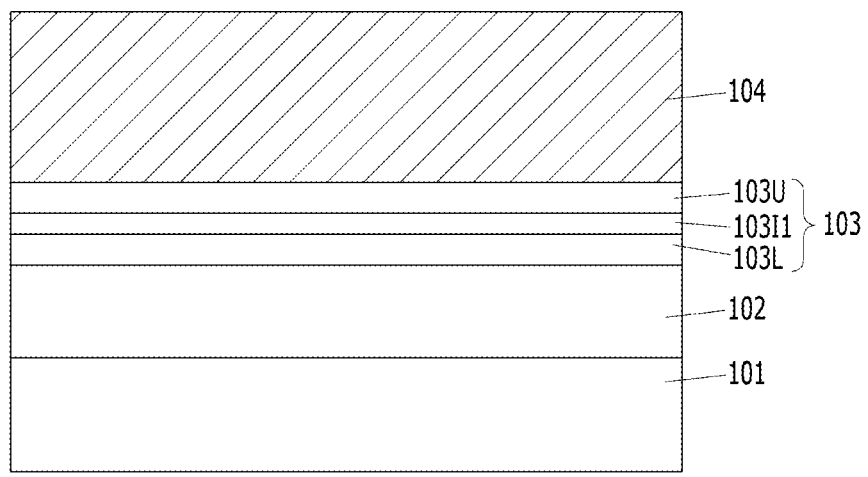

FIGS. 3A to 3C are cross-sectional views illustrating another example of a method for fabricating the semiconductor device 100 shown in FIG. 1.

Referring to FIG. 3A, the dielectric layer 102 may be formed over the substrate 101. The dielectric layer 102 may be exposed to a subsequent annealing process. The dielectric layer 102 may include aluminum oxide ($Al_2O_3$). According to another embodiment of the present disclosure, the dielectric layer 102 may include a stack of silicon nitride, silicon oxide, and aluminum oxide.

The first barrier layer 103L may be formed over the dielectric layer 102. The first barrier layer 103L may include titanium nitride. The first barrier layer 103L may be formed by an Atomic Layer Deposition (ALD) process or a Chemical Vapor Deposition (CVD) process.

Referring to FIG. 3B, an interface layer 10311 may be formed over the first barrier layer 103L. Whereas the interface layer 1031 of FIG. 2B may be formed by an oxidation process, the interface layer 10311 of FIG. 3B may be formed by a deposition process.

As an example of forming the interface layer 10311, titanium nitride may be deposited over the first barrier layer 103L, and titanium oxynitride (TiON) may be deposited by simultaneously flowing oxygen gas during the deposition of titanium nitride. The thickness of the interface layer 10311 may be the same as the thickness of the interface layer 1031 of FIG. 2B.

The process of forming the interface layer 10311 may be performed in-situ in the chamber in which the first barrier layer 103L is formed. The interface layer 10311 may be thinner than the first barrier layer 103L.

The first barrier layer 103L may be formed of titanium nitride (TiN), and the interface layer 10311 may be formed of titanium oxynitride (TiON).

Referring to FIG. 3C, the second barrier layer 103U may be formed over the interface layer 1031. The second barrier layer 103U and the first barrier layer 103L may be of the same material. According to another embodiment of the present disclosure, the second barrier layer 103U and the first barrier layer 103L may be of different materials. The first barrier layer 103L and the second barrier layer 103U may have the same thickness or they may have different thicknesses. The second barrier layer 103U may include titanium nitride. The second barrier layer 103U may be formed in-situ or ex-situ after the formation of the interface layer 10311.

By the series of processes described above, the interface control layer 103 may be formed, and the interface control layer 103 may include a stack of the first barrier layer 103L, the interface layer 10311, and the second barrier layer 103U. The first barrier layer 103L and the second barrier layer 103U may include titanium nitride, and the interface control layer 10311 may include titanium oxynitride (TiON). Accordingly, the interface control layer 103 may include a TiN/TiON/TiN stack.

Subsequently, the conductive layer 104 may be formed over the second barrier layer 103U. The conductive layer 104 may include tungsten. A tungsten layer as the conductive layer 104 may use tungsten hexafluoride ($WF_6$) as a base material. The tungsten hexafluoride ($WF_6$) be a tungsten source gas that is used to form a tungsten layer. The tungsten layer may be deposited using a tungsten source gas and a reaction gas. The tungsten source gas may include tungsten hexafluoride gas. The reaction gas may include a hydrogen-containing gas. For example, the reaction gas may include $H_2$, $SiH_4$ or $B_2H_6$.

Figure 4A:
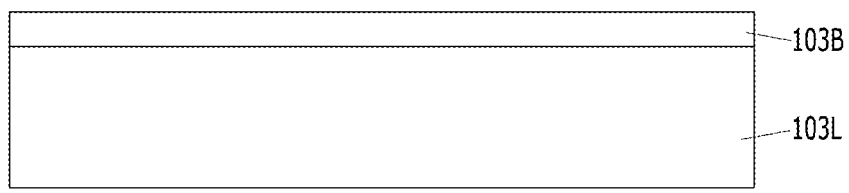
FIGS. 4A to 4E are cross-sectional views illustrating yet another example of the method for fabricating the semiconductor device shown in FIG. 1.
Figure 4B:
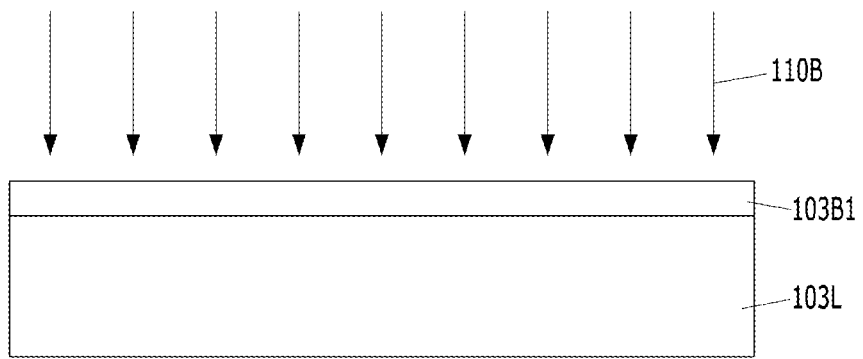
Figure 4C:
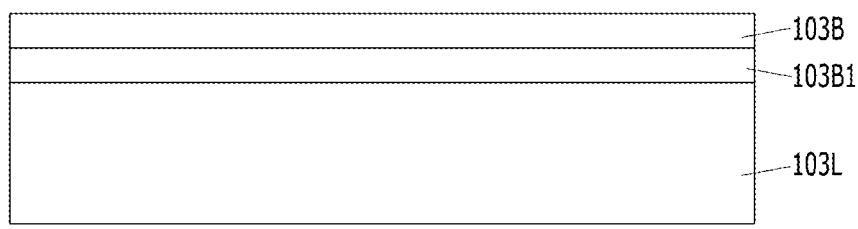

FIGS. 4A to 4C are diagrams illustrating another example of a method for fabricating the semiconductor device 100 shown in FIG. 1. The fabrication method of FIGS. 4A to 4C may be similar to the fabrication method shown in FIGS. 3A to 3C. In particular, an interface layer 10312 may be deposited on the first barrier layer 103L. The interface layer 10312, which will be described hereafter, may be formed by repeatedly performing a deposition process of a base layer 103B and an oxidation process 110B of the base layer 103B several times. The first barrier layer 103L, the interface layer 10312, and the second barrier layer 103U will now be described in more detail.

Referring to FIG. 4A, a base layer 103B may be formed over the first barrier layer 103L. The base layer 103B may be formed of the same material as that of the first barrier layer 103L. The base layer 103B and the first barrier layer 103L may include titanium nitride. The first barrier layer 103L and the base layer 103B may be formed by an Atomic Layer Deposition (ALD) process or a Chemical Vapor Deposition (CVD) process. The base layer 103B may be extremely thin. The base layer 103B may be substantially thinner than the first barrier layer 103L.

Referring to FIG. 4B, the base 103B may be exposed to oxidation process 110B. The oxidation process 110B may be performed in-situ in the chamber in which the base layer 103B is deposited. According to another embodiment of the present disclosure, the oxidation process 110B may be performed ex-situ in another chamber that is different from the chamber in which the base layer 103B is deposited.

The base layer 103B may be fully oxidized by the oxidation process 110B. Accordingly, an ultra-thin interface layer 103B1 may be formed. When the base layer 103B includes titanium nitride (TiN), the ultra-thin interface layer 103B1 may include titanium oxynitride (TiON).

Figure 4D:
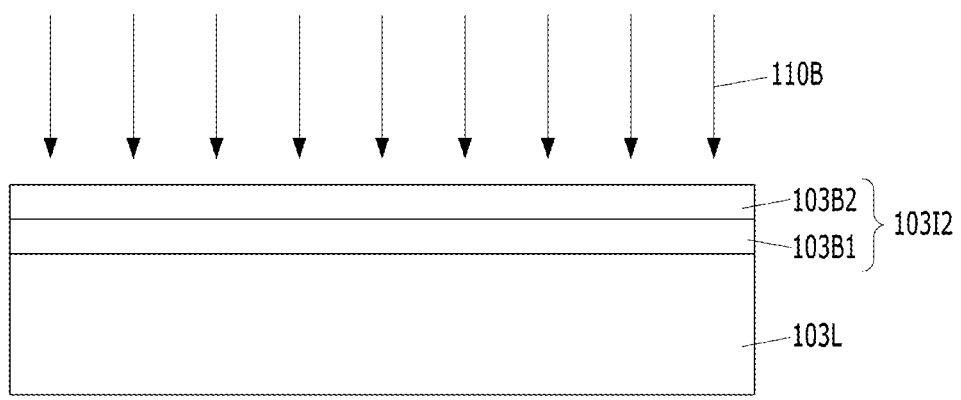

Referring to FIGS. 4C and 4D, another ultra-thin interface layer 103B2 may be additionally formed by repeating the deposition process of the base layer 103B and the oxidation process 110B of the base layer 103B.

In this manner, which is described above, the interface layer 10312 including the ultra-thin interface layers 103B1 and 103B2 may be formed by repeatedly performing the deposition process of the base layer 103B and the oxidation process 1108 of the base layer 103B. The total thickness of the resulting interface layer 103I2 may be approximately 3 to 20 Å, and each of the ultra-thin interface layers 103B1 and 103B2 may be approximately 1 to 10 Å.

Figure 4E:
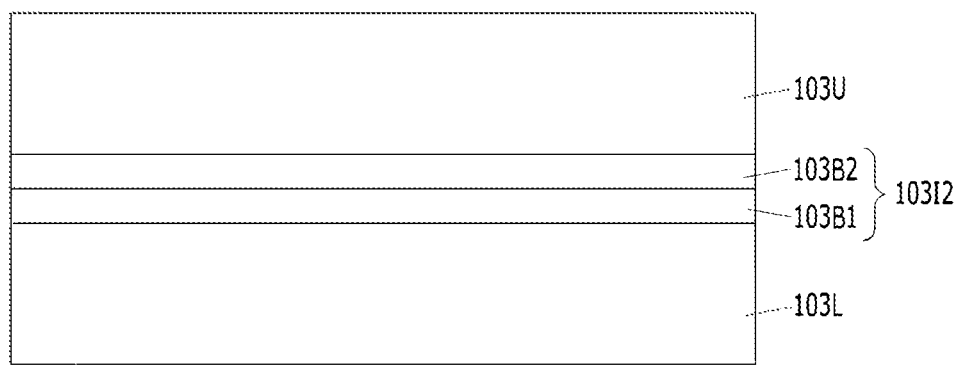

Subsequently, as shown in FIG. 4E, the second barrier layer 103U may be formed over the interface layer 103I2. The second barrier layer 103U may include titanium nitride. The second barrier layer 103U may be formed in-situ or ex-situ after the formation of the interface layer 103I2.

Figure 5:
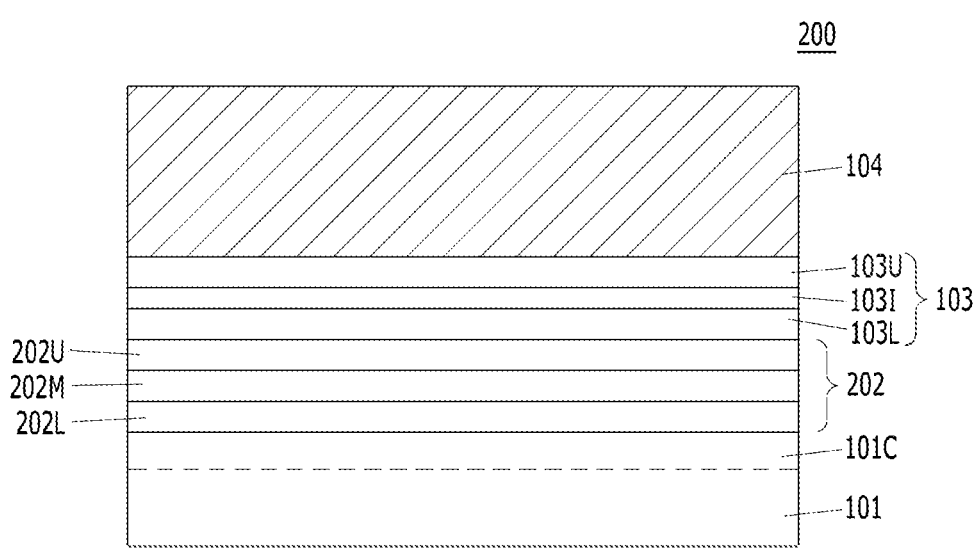
FIG. 5 is a cross-sectional view illustrating a semiconductor device in accordance with another embodiment of the present disclosure.

FIG. 5 is a cross-sectional view illustrating a semiconductor device 200 in accordance with another embodiment of the present disclosure. The semiconductor device 200 shown in FIG. 5 may have the same constituent elements as those of the semiconductor device 100 shown in FIG. 1, except for a dielectric layer 202. Hereinafter, detailed descriptions of the same constituent elements will be omitted.

Referring to FIG. 5, the semiconductor device 200 may include a substrate 101, a dielectric layer 202 over the substrate 101, a conductive layer 104 over the dielectric layer 202, and an interface control layer 103 between the conductive layer 104 and the dielectric layer 202. The semiconductor device 200 may be part of a non-volatile memory, and the conductive layer 104 may be referred to as a gate electrode. A channel region 101C may be formed on the surface of the substrate 101.

The dielectric layer 202 may include a tunnel dielectric layer 202L, a charge storage layer 202M, and a blocking layer 202U. The tunnel dielectric layer 202L may directly contact the channel region 101C of the substrate 101, and the blocking layer 202U may directly contact a first barrier layer 103L. The charge storage layer 202M may be formed between the tunnel dielectric layer 202L and the blocking layer 202U. The tunnel dielectric layer 202L may include silicon oxide. The charge storage layer 202M may include silicon nitride. The blocking layer 202U may include silicon oxide, aluminum oxide, or a stack of silicon oxide and aluminum oxide.

The semiconductor device 200 may store data through an operation of programming or erasing electrons in and out of the charge storage layer 202M. In such an embodiment, since the interface control layer 103 includes an interface layer 103I, back tunneling of electrons may be sufficiently blocked off. Conventional devices are limited by blocking the back tunneling of electrons with only the blocking layer 202U and the first and second barrier layers 103L and 103U in the absence of the interface layer 103 of the present disclosure.

Since the interface control layer 103 is formed, the thickness of the conductive layer 104 may be reduced, and the resistance of the conductive layer 104 may be lowered.

Since the interface layer 103I blocks the infiltration of impurities or reaction by-products generated during the deposition of the conductive layer 104, the blocking layer 202U may be protected from being attacked.

Referring to FIGS. 1 to 5, the interface layers 103I, 103I1, and 103I2 may be conductive titanium oxynitrides having a low oxygen content.

Figure 6A:
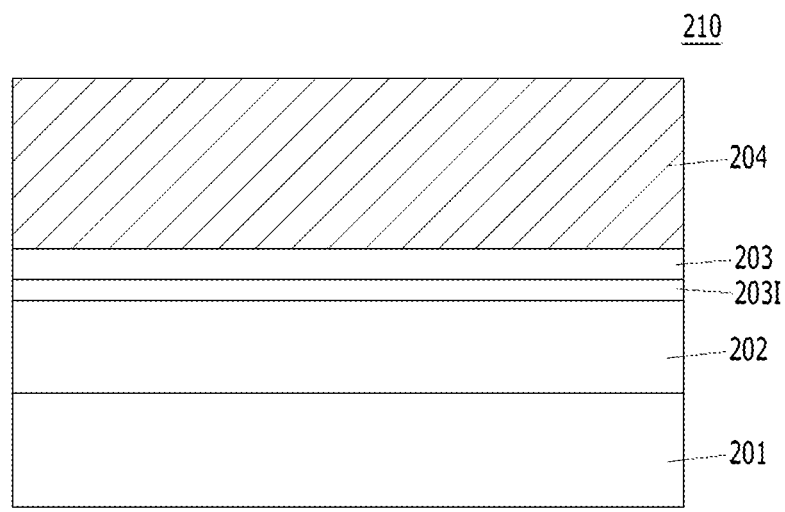
FIG. 6A to 6E illustrate a semiconductor device in accordance with another embodiment of the present disclosure.
Figure 6B:
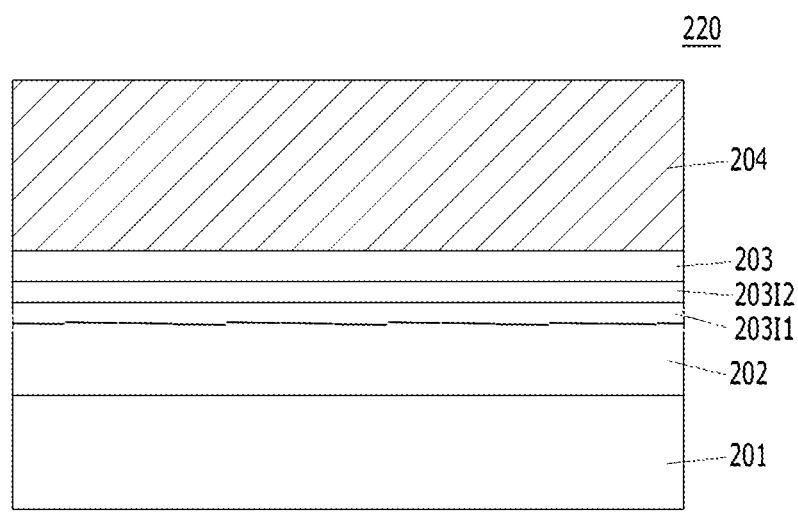
Figure 6C:
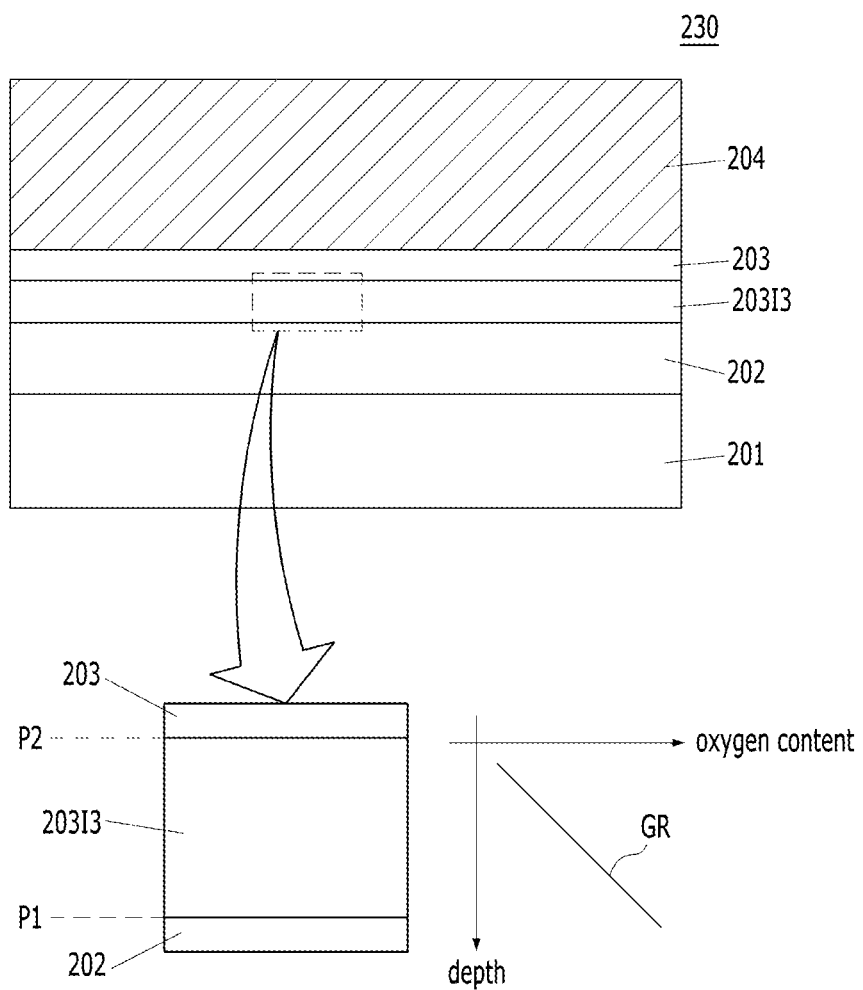

FIG. 6A to 6C illustrate a semiconductor device 210 in accordance with another embodiment of the present disclosure.

Referring to FIG. 6A, a semiconductor device 210 may include a substrate 201, a dielectric layer 202 over the substrate 201, an interface control layer 203I over the dielectric layer 202, a barrier layer 203 over the interface control layer 203I, and the conductive layer 204 over the barrier layer 203.

The dielectric layer 202 may include silicon oxide, silicon nitride, a high-k material, or a combination thereof. The dielectric layer 202 may include a single-layered material, a multi-layered material, laminated materials, intermixed materials, or a combination thereof. As the dielectric layer 202, the high-k material may have a dielectric constant of approximately 20 or more. The high-k material may include hafnium oxide ($HfO_2$), zirconium oxide ($ZrO_2$), aluminum oxide ($Al_2O_3$), or a combination thereof.

The conductive layer 204 may include a low-resistance material. The conductive layer 204 may include a semiconductor material, a metal, a metal nitride, a metal silicide, or a combination thereof. In this embodiment of the present disclosure, the conductive layer 204 may include tungsten. A tungsten layer as the conductive layer 104 may use tungsten hexafluoride ($WF_6$) as a base material. The tungsten hexafluoride ($WF_6$) be a tungsten source gas that is used to form a tungsten layer. The tungsten layer may be deposited using a tungsten source gas and a reaction gas. The tungsten source gas may include tungsten hexafluoride gas. The reaction gas may include a hydrogen-containing gas. For example, the reaction gas may include $H_2$, $SiH_4$ or $B_2H_6$.

The interface control layer 203I may include a dielectric material. The interface control layer 203I may contain oxygen. The interface control layer 203I may be a metal nitride containing oxygen, and the oxygen-containing metal nitride may be a dielectric material. The interface control layer 203I may be titanium nitride containing oxygen. The interface control layer 203I may be a dielectric titanium oxynitride. The dielectric titanium oxynitride may be different from the conductive titanium oxynitride. The conductive titanium oxynitride may have a first oxygen content, and the dielectric titanium oxynitride may have a second oxygen content that is higher than the first oxygen content of the conductive titanium oxynitride.

The barrier layer 203 may include a conductive material. The barrier layer 203 may include a metal nitride. The barrier layer 203 may include titanium nitride.

The barrier layer 203 may be oxygen-free titanium nitride, and the interface control layer 203I may be oxygen-containing titanium nitride.

The dielectric titanium oxynitride as the interface control layer 203I may be formed by simultaneously flowing an oxygen-containing gas during the deposition of titanium nitride. According to another embodiment of the present disclosure, the dielectric titanium oxynitride as the interface control layer 203I may be formed by depositing and oxidizing the titanium nitride.

Referring to FIG. 6B, the semiconductor device 220 may be similar to the semiconductor device 210 shown in FIG. 6A.

The semiconductor device 220 may include a substrate 201, a dielectric layer 202 over the substrate 201, a first interface control layer 203I1 over the dielectric layer 202, a second interface control layer 203I2 over the first interface control layer 203I1, a barrier layer 203 over the second interface control layer 203I2, and a conductive layer 204 over the barrier layer 203. As described above, the first interface control layer 203I1 and the second interface control layer 203I2 may be formed between the barrier layer 203 and the dielectric layer 202.

The first interface control layer 203I1 and the second interface control layer 203I2 may have different oxygen contents. The first interface control layer 203I1 may have a higher oxygen content than the second interface control layer 203I2. The first interface control layer 203I1 may be a dielectric material, and the second interface control layer 203I2 may be a conductive material.

The first interface control layer 203I1 and the second interface control layer 203I2 may contain oxygen. The first and second interface control layers 203I1 and 203I2 may be metal nitrides containing oxygen. The first and second interface control layers 203I1 and 203I2 may be titanium nitride containing oxygen. The titanium nitride containing oxygen may include titanium oxynitride, and thus the first and second interface control layers 203I1 and 203I2 may be titanium oxynitride.

The first interface control layer 203I1 may be titanium oxynitride having a high oxygen content, and the second interface control layer 203I2 may be titanium oxynitride having a low oxygen content. Accordingly, the first interface control layer 203I1 may be a dielectric titanium oxynitride, and the second interface control layer 203I2 may be conductive titanium oxynitride.

The titanium oxynitrides as the first interface control layer 203I1 and the second interface control layer 203I2 may be formed by simultaneously flowing an oxygen-containing gas when titanium nitride is deposited. According to another embodiment, titanium oxynitrides as the first interface control layer 203I1 and the second interface control layer 203I2 may be formed by depositing titanium nitride and oxidizing the titanium nitride.

According to another embodiment of the present disclosure, the second interface control layer 203I2 may be titanium nitride free of oxygen.

Referring to FIG. 6C, a semiconductor device 230 may include a substrate 201, a dielectric layer 202 over the substrate 201, an interface control layer 203I3 over the dielectric layer 202, a barrier layer 203 over the interface control layer 203I3, and a conductive layer 204 over the barrier layer 203. As such, the interface control layer 203I3 may be formed between the barrier layer 203 and the dielectric layer 202.

The interface control layer 203I3 may contain oxygen, and the oxygen may be distributed according to a gradient GR in which the content of oxygen gradually decreases according to depth (or thickness). The interface control layer 203I3 may include a lower surface P1 in contact with the dielectric layer 202, and an upper surface P2 in contact with the barrier layer 203. The oxygen content may be the highest on the lower surface P1, and the oxygen content may be the lowest on the upper surface P2. The oxygen content may gradually increase from the upper surface P2 to the lower surface P1 along the depth direction. The corollary is that the oxygen content may gradually decrease from the lower surface P1 to the upper surface P2. The oxygen content in the interface control layer 203I3 may have a linear distribution profile. The lower surface P1 may be a dielectric phase, and the upper surface P2 may be a conductive phase. Therefore, the interface control layer 203I3 may have a structure in which a conductive phase and a dielectric phase are mixed in the same layer structure.

The interface control layer 203I3 may include titanium oxynitride. The lower surface P1 may be a dielectric titanium oxynitride phase, and the upper surface P2 may be a conductive titanium oxynitride phase.

As described above, the interface control layer 203I3 may include an oxygen-graded titanium oxynitride (oxygen-graded TiON) in which the oxygen content gradually decreases along the depth direction.

Titanium oxynitride as the interface control layer 203I3 may be formed by simultaneously flowing an oxygen-containing gas when titanium nitride is deposited. According to another embodiment of the present disclosure, the titanium oxynitride as the interface control layer 203I3 may be formed by depositing titanium nitride and oxidizing the titanium nitride.

Figure 6D:
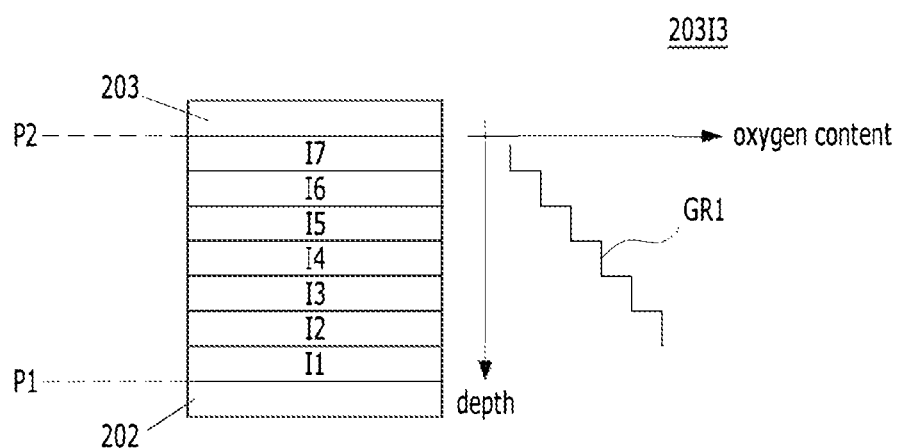
Figure 6E:
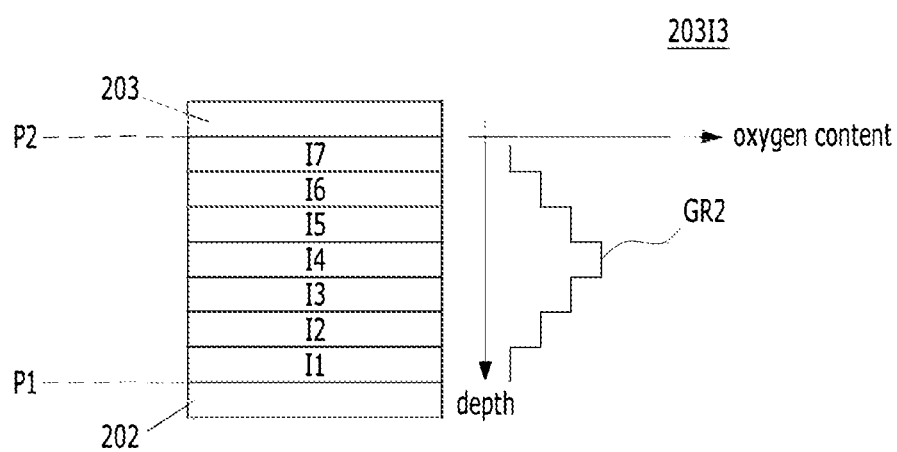

FIGS. 6D and 6E are modified examples of the embodiment of FIG. 6C, and the oxygen content in the interface control layer 203I3 may have an oxygen distribution according to stepped profiles GR1 or GR2.

Referring to FIGS. 6D and 6E, the interface control layer 203I3 may include a plurality of oxygen-control layers I1 to I7. The oxygen control layers I1 to I7 may include titanium oxynitride (TiON), but may have different oxygen contents.

In FIG. 6D, the interface control layer 203I3 may include first to seventh oxygen control layers I1 to I7. The oxygen content of the first oxygen control layer I1 may be the highest, and the oxygen content of the seventh oxygen control layer I7 may be the lowest. The interface control layer 203I3 may have a stepped profile GR1 in which the oxygen content increases stepwise from the seventh oxygen control layer I7 to the first oxygen control layer I1.

In FIG. 6E, the interface control layer 203I3 may include first to seventh oxygen control layers I1 to I7. The oxygen content of the fourth oxygen control layer I4 may be the highest, and the oxygen contents of the first and seventh oxygen control layers I1 and I7 may be the lowest. The oxygen content in the interface control layer 203I3 may have a stepped profile GR2. For example, the oxygen contents may increase stepwise as it goes from the seventh oxygen control layer I7 to the fourth oxygen control layer I4, and the oxygen contents may decrease stepwise as it goes from the fourth oxygen control layer I4 to the first oxygen control layer I1.

The interface control layer 203I3 of FIGS. 6D and 6E may be formed by the method shown in FIGS. 3A to 3C. In other words, titanium oxynitrides as the first to seventh oxygen control layers I1 to I7 may be formed by simultaneously flowing an oxygen-containing gas when titanium nitride is deposited. In the first to seventh oxygen control layers I1 to I7, the difference in oxygen contents may be obtained by adjusting the flow rate of the oxygen-containing gas.

The first to seventh oxygen control layers I1 to I7 may be dielectric titanium oxynitrides.

The interface control layer 203I3 of FIGS. 6D and 6E may be formed by the method shown in FIGS. 4A to 4E. In other words, the first to seventh oxygen control layers I1 to I7 may be formed by repeating a deposition process of a base layer and an oxidation process of the base layer several times. In the first to seventh oxygen control layers I1 to I7, the difference in oxygen contents may be adjusted by varying the thickness of the base layer or oxidation process parameters.

Figure 7:
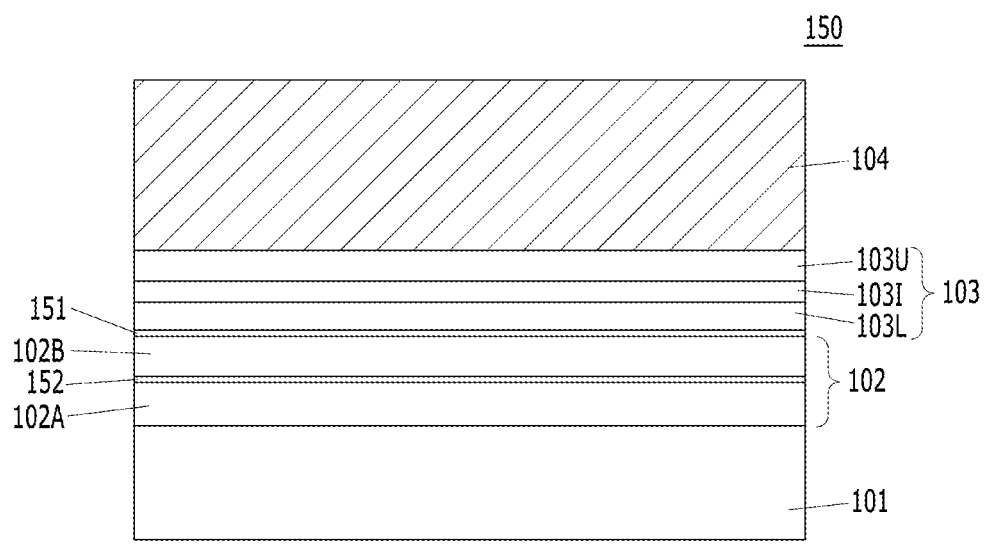
FIG. 7 is a cross-sectional view illustrating a semiconductor device in accordance with another embodiment of the present disclosure.

FIG. 7 is a cross-sectional view illustrating a semiconductor device in accordance with another embodiment of the present disclosure.

The semiconductor device 150 of FIG. 7 may be similar to the semiconductor device 100 shown in FIG. 1. Hereinafter, detailed description of the same constituent elements will be omitted.

Referring to FIG. 7, the semiconductor device 150 may include a substrate 101, a dielectric layer 102 over the substrate 101, an interface control layer 103 over the dielectric layer 102, and a conductive layer 104 over the interface control layer 103. The dielectric layer 102 may include a stack of a silicon oxide layer 102A and an aluminum oxide layer 102B. The interface control layer 103 may include a stack of a first barrier layer 103L, an interface layer 103I, and a second barrier layer 103U. The stack of the first barrier layer 103L, the interface layer 103I, and the second barrier layer 103U may include a TiN/TiO$_2$/TiN stack.

The semiconductor device 150 may further include an interface compound layer 151 between the interface control layer 103 and the dielectric layer 102. The interface compound layer 151 may have a higher dielectric constant and a greater work function than the aluminum oxide layer 102B.

The interface compound layer 151 may be a compound of the first barrier layer 103L and the dielectric layer 102. In other words, the interface compound layer 151 may be a compound that is formed by the reaction between the aluminum oxide layer 102B and the first barrier layer 103L.

When the first barrier layer 103L includes titanium nitride, the interface compound layer 151 may be a material that is formed by the reaction between the titanium nitride and the aluminum oxide layer 102B. As described in the above embodiments of the present disclosure, the aluminum oxide layer 102B and the first barrier layer 103L may react during the formation of the interface control layer 103. Accordingly, the interface compound layer 151 may be formed on the interface between the aluminum oxide layer 102B and the first barrier layer 103L. The interface compound layer 151 may include AlTiON or AlTiO.

The semiconductor device 150 may further include an interface enhancement layer 152 between the silicon oxide layer 102A and the aluminum oxide layer 102B. During the oxidation process for forming the interface layer 103I of the interface control layer 103, the interface enhancement layer 152 may be formed at the interface between the silicon oxide layer 102A and the aluminum oxide layer 102B. The interface enhancement layer 152 may not only improve the film quality of the silicon oxide layer 102A but also stably maintain the thickness of the silicon oxide layer 102A. The interface enhancement layer 152 may be a silicon oxide growth layer that is obtained as a surface of the silicon oxide layer 102A is oxidized and grown.

The interface compound layer 151 and the interface enhancement layer 152 of FIG. 7 may be applied to the embodiment of semiconductor device 200 of FIG. 5 and the semiconductor devices 210, 220, and 230 of FIGS. 6A to 6C.

Figure 8A:
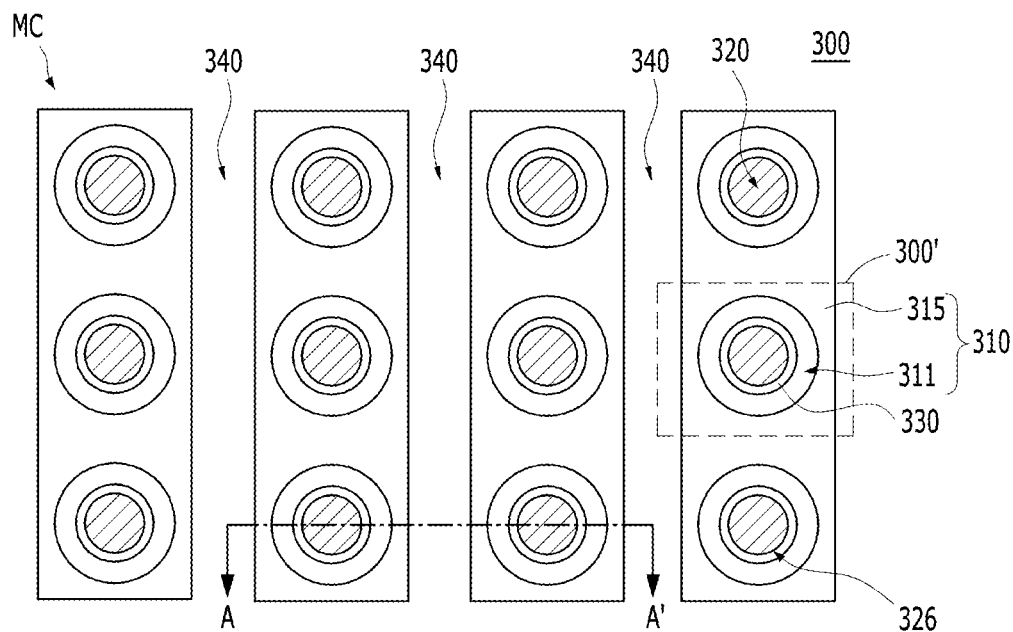
FIGS. 8A to 8D are plan views illustrating a vertical semiconductor device.
Figure 8B:
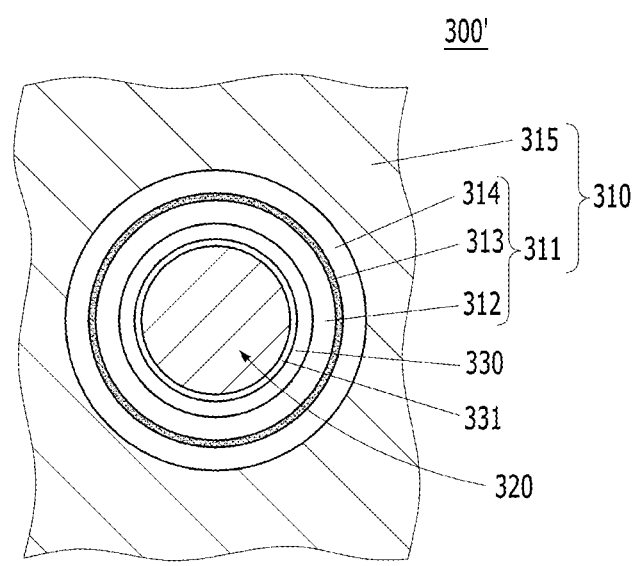
Figure 8C:
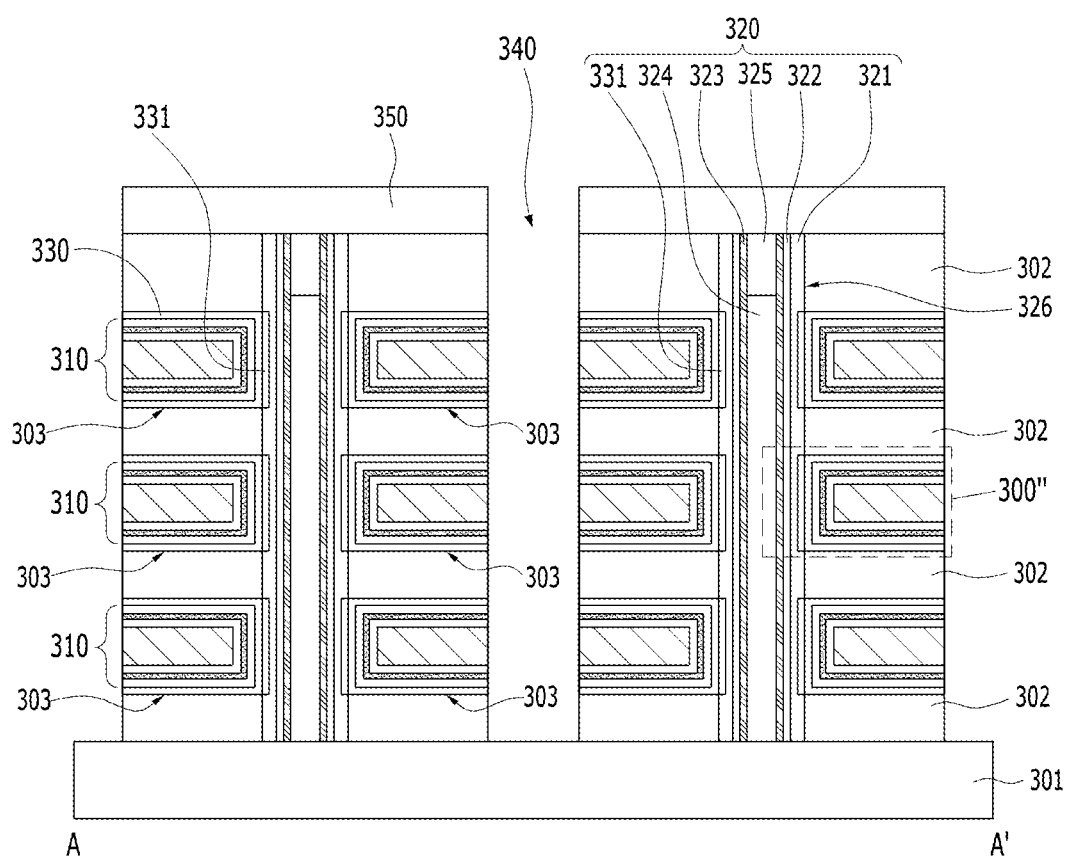
Figure 8D:
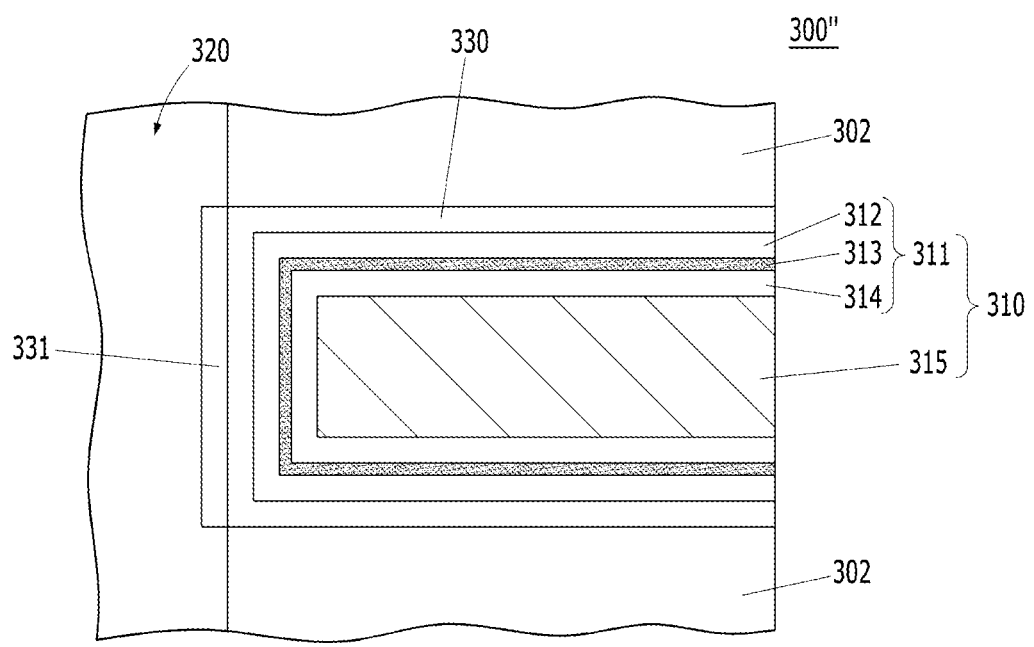

FIGS. 8A to 8D are plan views illustrating a vertical semiconductor device. FIG. 8B is a detail view of a portion 300' of a vertical semiconductor device 300 shown in FIG. 8A. FIG. 8C is a cross-sectional view taken along the line A-A' shown in FIG. 8A. FIG. 8D is a detailed view of a portion 300" of vertical semiconductor device 300 shown in FIG. 8C.

FIGS. 8A to 8D, the vertical semiconductor device 300 may include vertical NAND memory. The vertical semiconductor device 300 may include a three-dimensional (3D) NAND memory. The vertical semiconductor device 300 may include a lower structure 301 and a cell stack MC. The cell stack MC may be formed over a lower structure 301. The cell stack MC may be formed by alternately and repeatedly stacking a dielectric layer 302 and a gate structure 310. The vertical semiconductor device 300 may further include a plurality of vertical channel structures 320 that penetrate the cell stack MC.

The space between the dielectric layers 302 may be defined as a horizontal recess 303, and the horizontal recess 303 may be filled with the gate structure 310. The gate structure 310 may be referred to as a 'horizontal word line' or a 'horizontal gate electrode'.

The gate structure 310 may include a multi-layered material surrounding the vertical channel structures 320. The gate structure 310 may include an interface control layer 311 and a gate electrode 315. The interface control layer 311 may include a first barrier layer 312, an interface layer 313, and a second barrier layer 314 (see FIGS. 8B and 8D). The interface control layer 311 may include a TiN/TiO$_2$/TiN stack.

The vertical channel structure 320 may include a charge storage layer 321 that is adjacent to the gate structure 310, a tunnel dielectric layer 322 that is in contact with the charge storage layer 321, and a channel layer 323 that is in contact with the tunnel dielectric layer 322. The internal space of the channel layer 323 may be filled with a core dielectric layer 324. A conductive pad 325 may be formed over the core dielectric layer 324. The vertical channel structure 320 may be formed in a channel hole 326. The channel hole 326 may have a shape penetrating the cell stack MC. The tunnel dielectric layer 322 may be shaped to surround the outer wall of the channel layer 323. The charge storage layer 321 may be shaped to surround the outer wall of the tunnel dielectric layer 322.

The vertical semiconductor device 300 may further include a first blocking layer 330 and a second blocking layer 331. The first blocking layer 330 may contact the outer wall of the charge storage layer 321. The first blocking layer 330 may be positioned between the charge storage layer 321 and the interface control layer 311. The first blocking layer 330 may include aluminum oxide (Al$_2$O$_3$). The second blocking layer 331 may be formed between the first blocking layer 330 and the charge storage layer 321. The second blocking layer 331 may be a material obtained by oxidizing a portion of the surface of the charge storage layer 321. The second blocking layer 331 may include silicon oxide or silicon oxynitride. The first blocking layer 330 and the second blocking layer 331 may be of different materials. According to another embodiment of the present disclosure, the second blocking layer 331 may be omitted. The second blocking layer 331 may be a portion of the vertical channel structure 320, and the second blocking layer 331 may be in contact with the charge storage layer 321.

The neighboring cell stacks MC may be separated from each other by a slit 340. The slit 340 may have a trench shape. The neighboring gate structure 310 may be separated into blocks by the slits 340. One block may include one gate structure 310 and a plurality of vertical channel structures 320. In each block, the plurality of vertical channel structures 320 may share one gate structure 310. From the perspective of a top view, the plurality of vertical channel structures 320 may be regularly arranged. Although FIG. 8A illustrates an embodiment in which one block includes three vertical channel structures 320, in other embodiments, a memory block may have a different number of vertical channel structures 320.

The top surfaces of the cell stack MC and the vertical channel structures 320 may be covered by a capping layer 350.

Figure 9A:
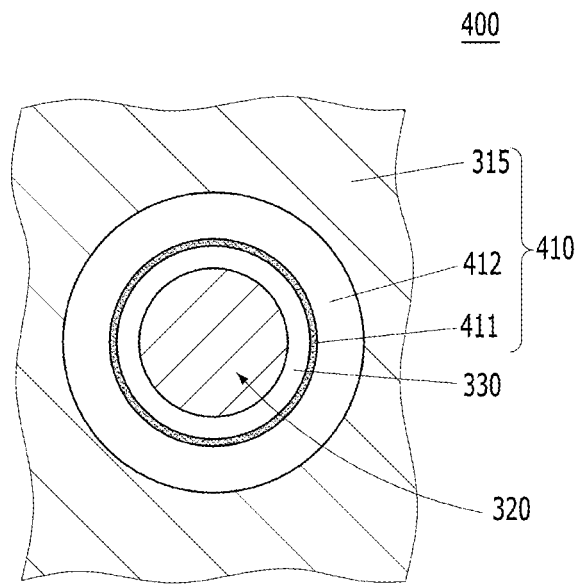
FIGS. 9A to 9C are plan views illustrating vertical semiconductor devices in accordance with other embodiments of the present disclosure.
Figure 9B:
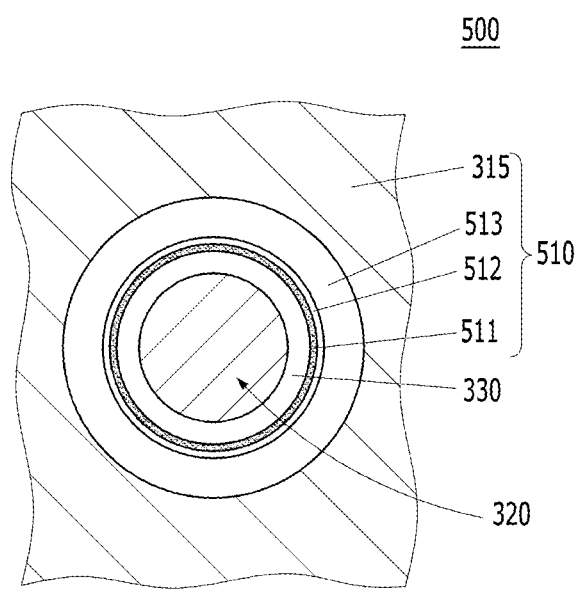
Figure 9C:
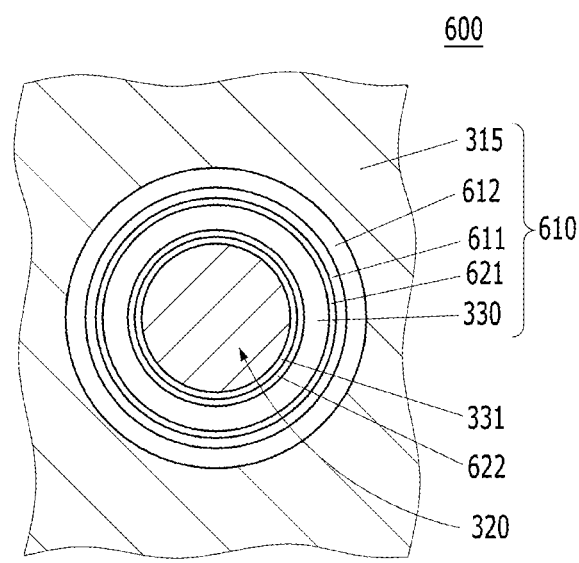

FIGS. 9A to 9C are plan views illustrating vertical semiconductor devices in accordance with other embodiments of the present disclosure.

The constituent elements of a vertical semiconductor device 400 shown in FIG. 9A and a vertical semiconductor device 500 shown in FIG. 9B may be similar to those of the semiconductor device 300 shown in FIGS. 8A to 8D, except for gate structures 410 and 510.

Referring to FIG. 9A, the vertical semiconductor device 400 may include a gate structure 410 that surrounds the vertical channel structure 320. The vertical channel structure 320 may include a charge storage layer 321, a tunnel dielectric layer 322, a channel layer 323, a core dielectric layer 324, and a second blocking layer 331 as shown in FIG. 8C. A first blocking layer 330 may be formed between the vertical channel structure 320 and the gate structure 410. The gate structure 410 may include an interface control layer 411, a barrier layer 412, and a gate electrode 315. The interface control layer 411 is a dielectric material and may include titanium oxide ($TiO_2$) or titanium oxynitride (TiON). The barrier layer 412 may include titanium nitride. The stack of the interface control layer 411 and the barrier layer 412 may include a $TiO_2$/TiN stack or a TiON/TiN stack.

Referring to FIG. 9B, the vertical semiconductor device 500 may include a gate structure 510 surrounding the vertical channel structure 320. The vertical channel structure 320 may include a charge storage layer 321, a tunnel dielectric layer 322, a channel layer 323, a core dielectric layer 324, and a second blocking layer 331 as shown in FIG. 8C. The first blocking layer 330 may be formed between the vertical channel structure 320 and the gate structure 510. The gate structure 510 may include a dielectric interface control layer 511, a conductive interface control layer 512, a barrier layer 513, and a gate electrode 315. The dielectric interface control layer 511 is a dielectric material and may include titanium oxynitride (TiON) having a high oxygen content. The conductive interface control layer 512 is a conductive material and may include titanium oxynitride having a small oxygen content. The barrier layer 513 may include titanium nitride.

The constituent elements of a vertical semiconductor device 600 of FIG. 9C may be similar to those of the semiconductor device 300 of FIGS. 7A to 7D, except for the gate structure 610.

Referring to FIG. 9C, the vertical semiconductor device 600 may include a gate structure 610 surrounding the vertical channel structure 320. The vertical channel structure 320 may include a charge storage layer 321, a tunnel dielectric layer 322, a channel layer 323, a core dielectric layer 324, and a second blocking layer 331 as shown in FIG. 8C. The first blocking layer 330 may be formed between the vertical channel structure 320 and the gate structure 610. The gate structure 610 may include an interface compound layer 621, an interface control layer 611, a barrier layer 612, and a gate electrode 315. The interface control layer 611 may include TiON, $TiO_2$, a TiN/$TiO_2$/TiN stack, a TiON/TiN stack, or a $TiO_2$/TiN stack. The barrier layer 612 may include titanium nitride.

The interface compound layer 621 may correspond to the interface compound layer 151 of FIG. 7. The interface compound layer 621 may have a higher dielectric constant and a greater work function than the first blocking layer 330.

The interface compound layer 621 may include a compound of the first blocking layer 330 and the interface control layer 611. For example, the interface compound layer 621 may be a compound that is formed by the reaction between the first blocking layer 330 and the interface control layer 611. The interface compound layer 621 may have an extremely thin thickness than the first blocking layer 330 and the interface control layer 611. The interface compound layer 621 may have a thickness of approximately 5 Å or less. The first blocking layer 330 may include a first element, and the interface control layer 611 may include a second element, and the interface compound layer 621 may include a compound of the first element and the second element.

When the first blocking layer 330 includes aluminum oxide and the interface control layer 611 includes a TiN/$TiO_2$/TiN stack, the interface compound layer 621 may include a compound of aluminum oxide and titanium nitride. The interface compound layer 621 may include a titanium oxide-based material, such as AlTiON or AlTiO.

The vertical semiconductor device 600 may further include an interface enhancement layer 622 between the first blocking layer 330 and the second blocking layer 331. The interface enhancement layer 622 may correspond to the interface enhancement layer 152 of FIG. 7. During the oxidation process for forming the interface layer 1031 of interface control layer 103, the interface enhancement layer 622 may be formed on an interface between the first blocking layer 330 and the second blocking layer 331. The interface enhancement layer 622 may not only improve the film quality of the second blocking layer 331, but also stably maintain the thickness of the second blocking layer 331. The interface enhancement layer 622 may be a silicon oxide growth layer that is obtained as a surface of the second blocking layer 331 is oxidized and grown.

FIGS. 10A to 10I are cross-sectional views illustrating an example of a method for fabricating a vertical semiconductor device. FIGS. 10A to 10I illustrate an example of a method for fabricating the vertical semiconductor device 300 shown in FIGS. 8A to 8D.

Figure 10A:
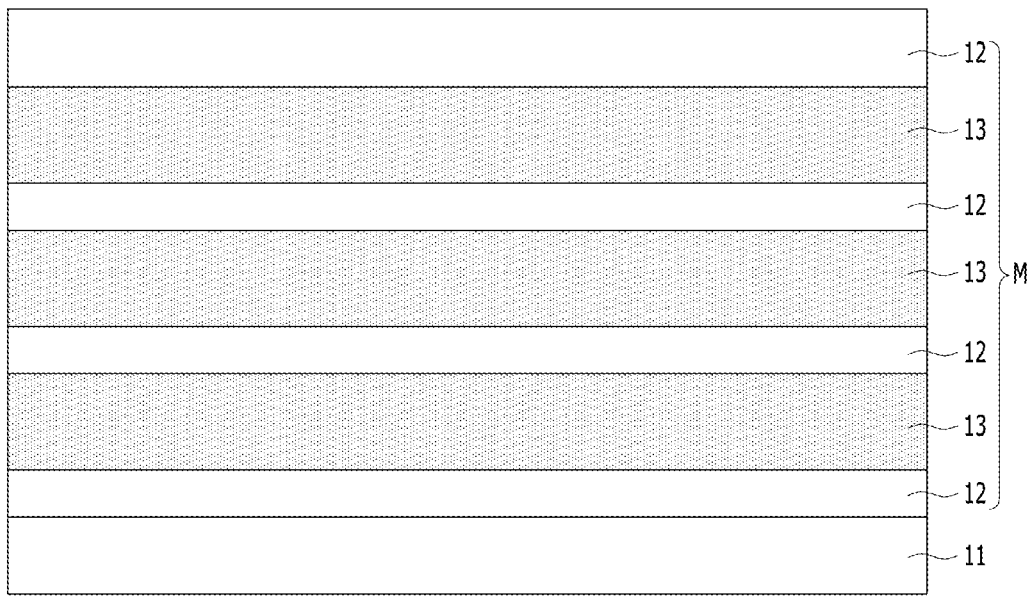
FIGS. 10A to 10I are cross-sectional views illustrating an example of a method for fabricating a vertical semiconductor device.

Referring to FIG. 10A, a stack structure M may be formed over the lower structure 11. In the stack structure M, the dielectric layer 12 and the sacrificial layer 13 may be alternately stacked. Each of the dielectric layer 12 and the sacrificial layer 13 may be formed of a plurality of layers. For the sake of convenience in description, although it is illustrated in the embodiment of the present disclosure that four dielectric layers 12 and three sacrificial layers 13 are alternately stacked, the number of the dielectric layers 12 and the sacrificial layers 13 may be arranged in various configurations. The dielectric layer 12 and the sacrificial layer 13 may be repeatedly stacked in a direction perpendicular to the surface of the lower structure 11. The dielectric layer 12 and the sacrificial layer 13 may be formed by a Chemical Vapor Deposition (CVD) process or an Atomic Layer Deposition (ALD) process. The dielectric layer 12 formed on top may be attacked and damaged by subsequent processes. Therefore, the top dielectric layer 12 may be formed thicker than the other dielectric layers 12 below. Each of the sacrificial layers 13 may have the same thickness.

The dielectric layer 12 and the sacrificial layer 13 may include materials having different etch selectivities for the same etching solution. The sacrificial layer 13 may be formed of a material that is different from that of the dielectric layer 12. The sacrificial layer 13 may be formed of a material having an etch selectivity with respect to the dielectric layer 12. The sacrificial layer 13 may be a material that may be quickly removed through a wet etch process. The dielectric layer 12 may be silicon oxide or silicon nitride, and the sacrificial layer 13 may be a material having an etch selectivity with respect to the dielectric layer 12. For example, the sacrificial layer 13 may be selected from silicon oxide, silicon nitride, silicon carbide, silicon or silicon germanium. In an embodiment, the dielectric layer 12 may be silicon oxide, and the sacrificial layer 13 may be silicon nitride.

The lower structure 11 may include a semiconductor substrate. The lower structure 11 may include a source region formed in the semiconductor substrate by impurity implantation. The lower structure 11 may include a source region that is formed by forming a doped polysilicon layer over the semiconductor substrate and then patterning the doped polysilicon layer. The lower structure 11 may include a pipe gate in which a pipe trench is formed. The lower structure 11 may include a semiconductor substrate and an etch stop layer over the semiconductor substrate.

Figure 10B:
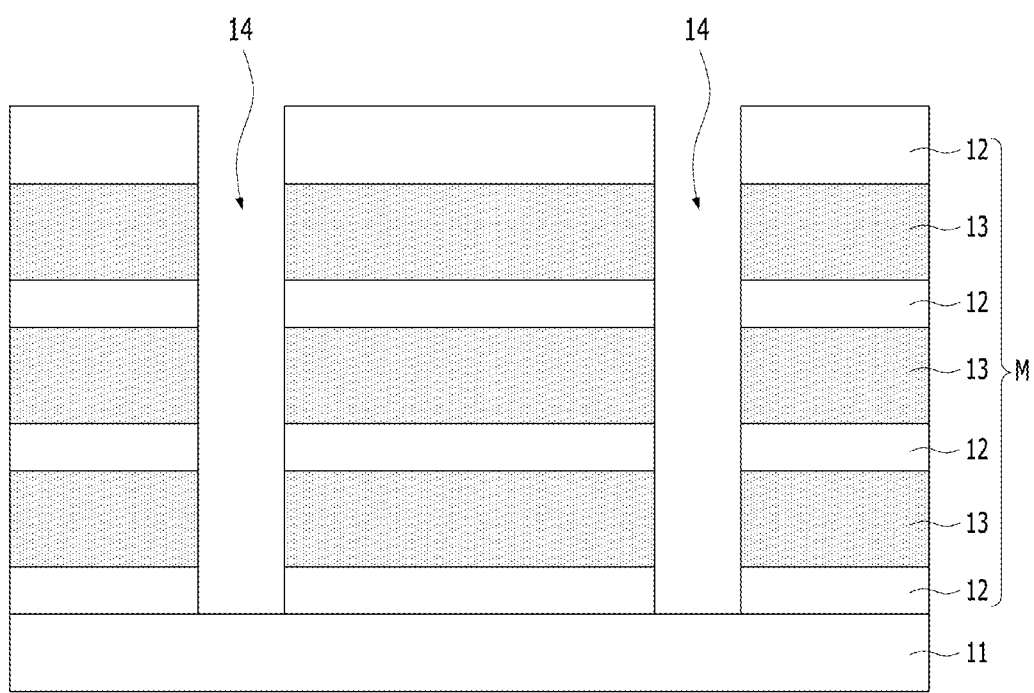

Referring to FIG. 10B, a channel hole 14 may be formed. The channel hole 14 may be formed by etching the stack structure M. For example, the dielectric layer 12 and the sacrificial layer 13 may be etched to form the channel hole 14 by sequentially performing anisotropic etch processes. An etch mask layer (not shown) may be used to form the channel hole 14. The surface of the lower structure 11 may be exposed on the bottom of the channel hole 14. The channel hole 14 may be formed in a direction perpendicular to the surface of the lower structure 11. The channel hole 14 may be referred to as a 'vertical recess'.

Although not shown, from the perspective of a plan view, a plurality of channel holes 14 may be formed as an array of holes. When the channel hole 14 is formed, the surface of the lower structure 11 may be over-etched.

Figure 10C:
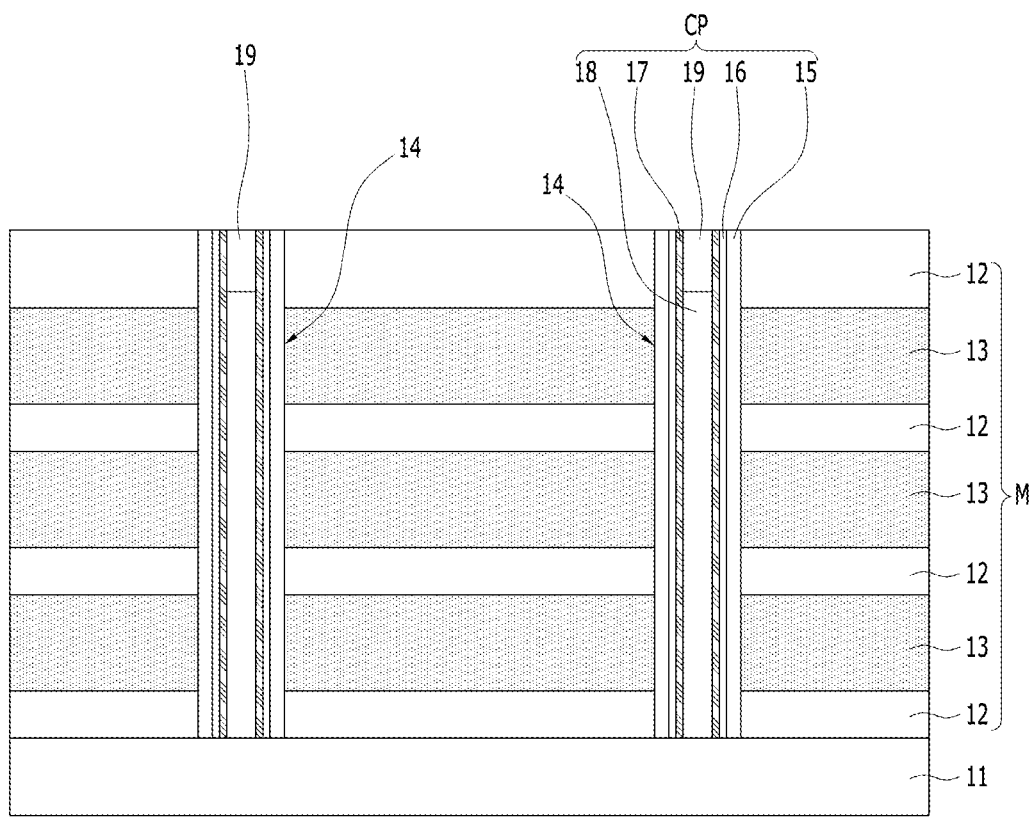

Referring to FIG. 10C, a vertical channel structure CP may be formed in the channel hole 14. The vertical channel structure CP may include a charge storage layer 15, a tunnel dielectric layer 16, and a channel layer 17. The charge storage layer 15 may include silicon nitride. The tunnel dielectric layer 16 may include silicon oxide. The channel layer 17 may include a semiconductor material. For example, the channel layer 17 may include one of a polycrystalline semiconductor material, an amorphous semiconductor material, or a monocrystalline semiconductor material. The channel layer 17 may include silicon (Si), germanium (Ge), silicon germanium (SiGe), a III-V group compound, or a II-VI group compound. The channel layer 17 may include polysilicon.

The channel layer 17, the tunnel dielectric layer 16, and the charge storage layer 15 may be formed as a spacer on the sidewalls of the channel hole 14. The channel layer 17, the tunnel dielectric layer 16, and the charge storage layer 15 may have shapes with open top and bottom surfaces. The channel layer 17 may have a tube shape with an inner space. The tunnel dielectric layer 16 may be formed on the outer wall of the channel layer 17, and the charge storage layer 15 may be formed on the outer wall of the tunnel dielectric layer 16. According to another embodiment, the channel layer 17 may have a shape whose top and bottom are open. The inner space of the channel layer 17 may be partially filled with a core layer 18. The core layer 18 may include silicon oxide or silicon nitride. The vertical channel structure CP may further include a conductive pad 19. The conductive pad 19 may be formed over the core dielectric layer 18. The inner space of the channel layer 17 may be filled with the core dielectric layer 18 and the conductive pad 19, and the combination of these materials may completely fill an inner space of channel layer 17. The conductive pad 19 may include polysilicon doped with an impurity. The conductive pad 19 may be electrically connected to the channel layer 17.

The vertical channel structure CP may be referred to as a 'pillar structure'.

According to another embodiment, the channel layer 17 may fill the inside of the channel hole 14 to fill the center area of the channel hole 14. In such an embodiment, the core dielectric layer 18 may be omitted, and the conductive pad 19 may be formed by doping the top portion of the channel layer 17 with an impurity.

Figure 10D:
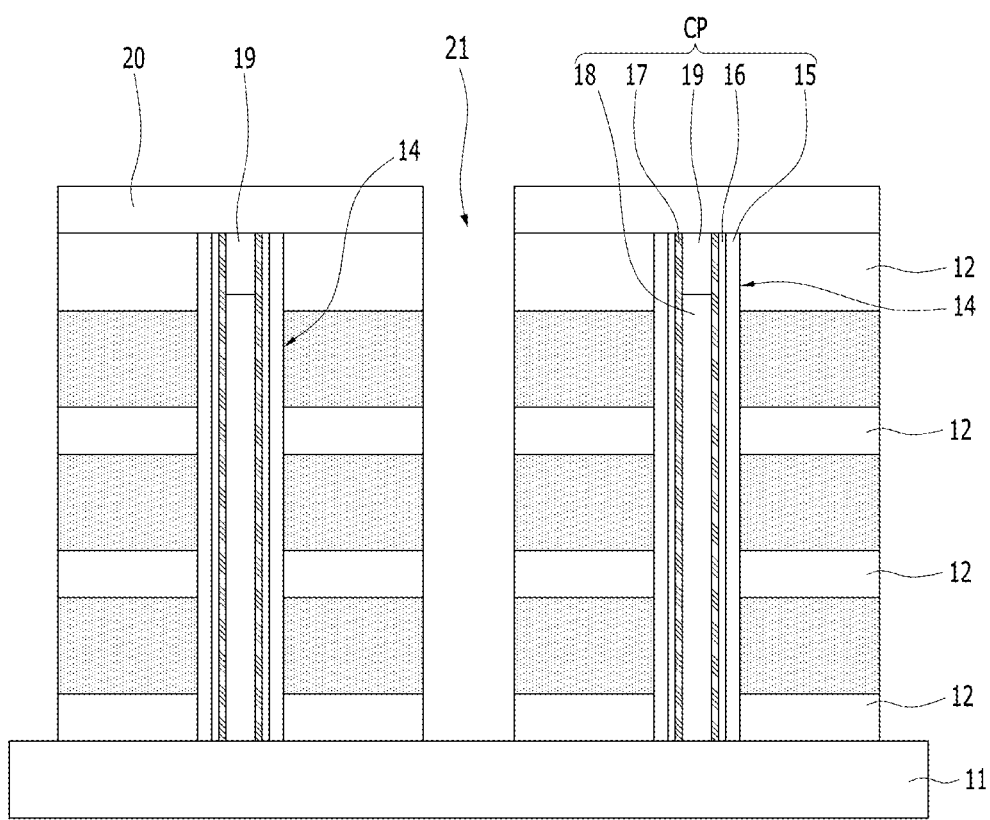

Referring to FIG. 10D, a plurality of slits 21 may be formed. The slits 21 may be vertical recesses. The slits 21 may be referred to as trenches. The stack structures M between the vertical channel structures CP may be etched to form the slits 21. For example, the dielectric layer 12 and the sacrificial layer 13 between the vertical channel structures CP may be selectively etched. The shape and number of the slits 21 may vary between different embodiments. The slits 21 may have a shape of lines extending parallel to each other with the vertical channel structures CP interposed therebetween. The slits 21 may expose the top surface of the lower structure 11 and the sidewalls of the dielectric layer 12 and the sacrificial layer 13. The slits 21 may be positioned between the plurality of vertical channel structures CP. Before the slits 21 are formed, a capping layer 20 may be formed. The capping layer 20 may protect the vertical channel structures CP while the slits 21 are formed. The capping layer 20 may be a pattern that is patterned by a mask layer (not shown). The capping layer 20 may be a material having an etch selectivity with respect to the dielectric layer 12 and the sacrificial layer 13. The capping layer 20 may include silicon oxide or silicon nitride.

Figure 10E:
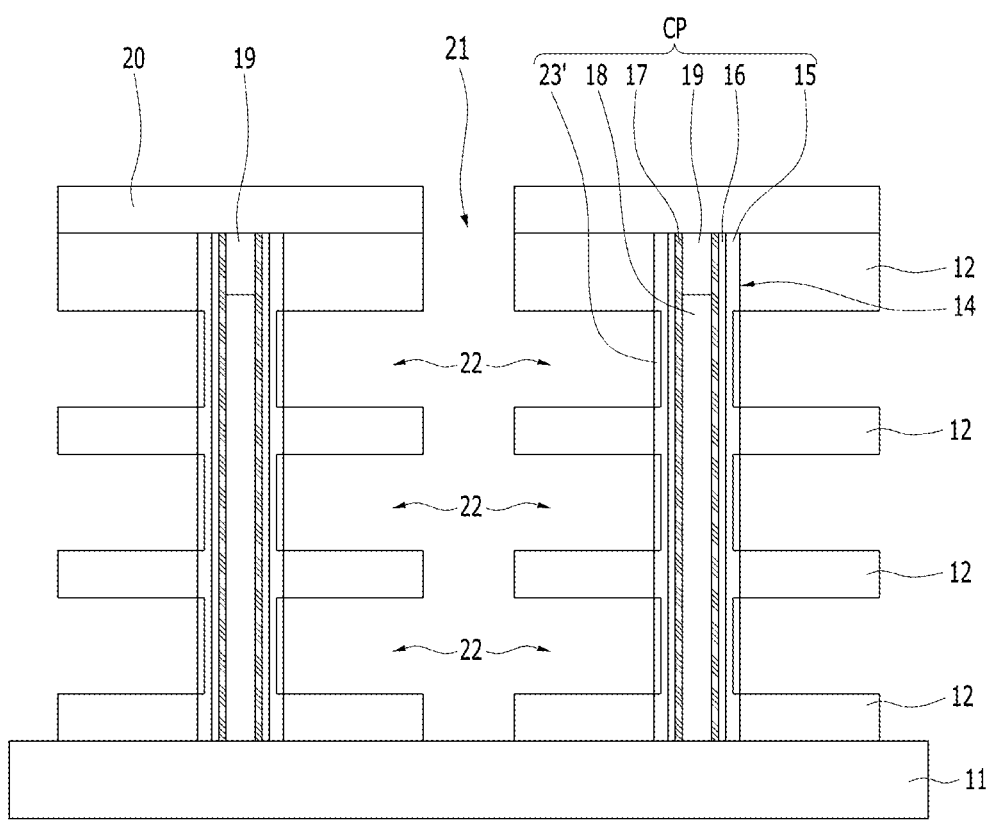

Referring to FIG. 10E, a plurality of horizontal recesses 22 may be formed. The horizontal recesses 22 may be formed by removing the sacrificial layer 13 exposed through the slits 21. Each of the horizontal recesses 22 may partially expose the sidewalls of a vertical channel structure CP. The horizontal recesses 22 may be formed by removing the sacrificial layer 13 through a wet etch process. For example, when the sacrificial layer 13 includes silicon nitride, the sacrificial layer 13 may be removed by a wet etch process using a phosphoric acid ($H_3PO_4$) solution. The horizontal recesses 22 may be formed between the dielectric layers 12 by removing the sacrificial layer 13. The sidewalls of the charge storage layers 15 may be partially exposed by the horizontal recess 22. The horizontal recesses 22 may have a high aspect ratio parallel to the surface of the lower structure 11.

The structure including the horizontal recesses 22 may be referred to as a 'gap-fill target structure'.

Figure 10F:
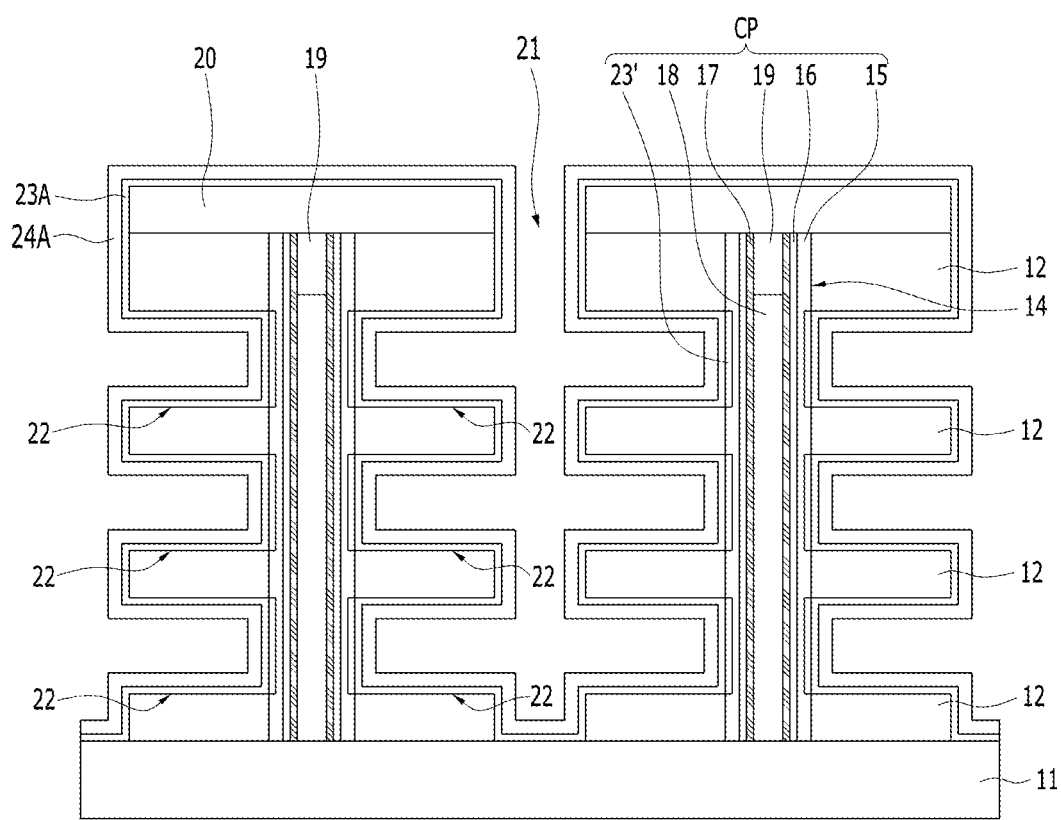

Referring to FIG. 10F, the first blocking material 23A may be formed. The first blocking material 23A may be formed on the exposed sidewall of the charge storage layer 15. The first blocking material 23A may include aluminum oxide. The first blocking material 23A may be conformally formed along the profile of the horizontal recess 22. The first blocking material 23A may be formed by a Chemical Vapor Deposition (CVD) process or an Atomic Layer Deposition (ALD) process. The first blocking material 23A may correspond to the first blocking layer 330 of FIGS. 8A to 8D.

Prior to the formation of the first blocking material 23A, a portion of the surface of the charge storage layer 15 exposed through the horizontal recess 22 may be oxidized. Accordingly, the second blocking layer 23' may be formed, and the second blocking layer 23' may correspond to the second blocking layer 331 of FIGS. 8A to 8D. The vertical channel structure CP may further include a second blocking layer 23'. According to another embodiment of the present disclosure, the second blocking layer 23' may be formed on the sidewall of the channel hole 14 by depositing silicon oxide before the charge storage layer 15 is formed.

Subsequently, the first blocking material 23A may be exposed to an anneal process.

Next, an initial barrier material 24A may be formed over the first blocking material 23A. The initial barrier material 24A may be conformally formed along the profile of the horizontal recesses 22. The initial barrier material 24A may line the surface of the horizontal recesses 22 over the first blocking material 23A. The initial barrier material 24A may include metal nitride. For example, the initial barrier material 24A may include titanium nitride (TiN). The horizontal recesses 22 in which the initial barrier material 24A is formed may be referred to as lined horizontal recesses.

Figure 10G:
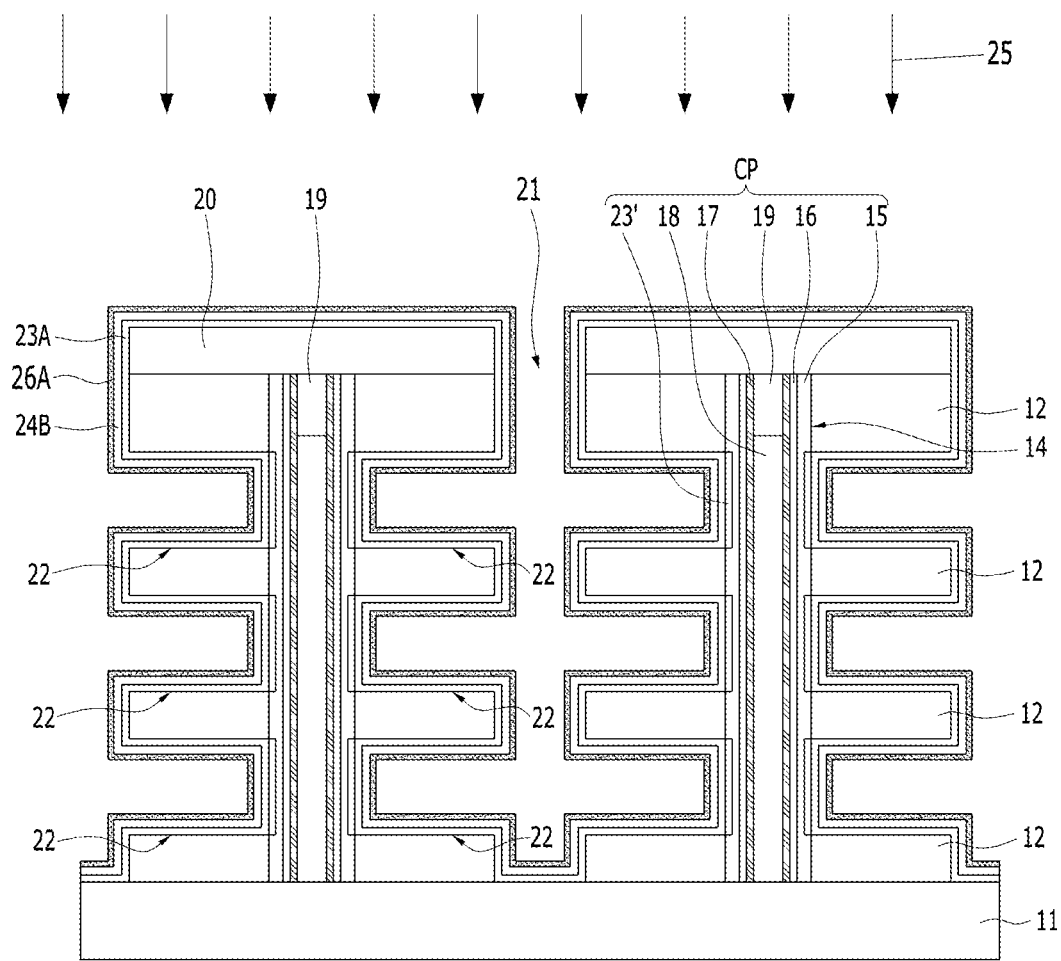

Referring to FIG. 10G, the initial barrier material 24A may be exposed to an oxidation process 25. The oxidation process 25 may selectively oxidize the surface of the initial barrier material 24A. A portion of the initial barrier material 24A may be oxidized by the oxidation process 25.

The first barrier material 24B and the interface material 26A may be formed by the oxidation process 25. The interface material 26A may be a partial oxide of the initial barrier material 24A. The first barrier material 24B may refer to the non-oxidized portion of initial barrier material 24A.

An interface material 26A may be formed as an ultra-thin layer. The interface material 26A may be thinner than the first barrier material 24B.

The first barrier material 24B may include titanium nitride. The interface material 26A may include titanium oxynitride.

During the deposition of the initial barrier material 24A and the oxidation process 25 of the initial barrier material 24A, an interface compound layer (not shown) may be formed by the reaction between the first blocking material 23A and the initial barrier material 24A (see FIG. 9C). Also, an interface enhancement layer (not shown) may be formed between the first blocking material 23A and the second blocking layer 23' during the oxidation process 25 (see FIG. 9C).

Figure 10H:
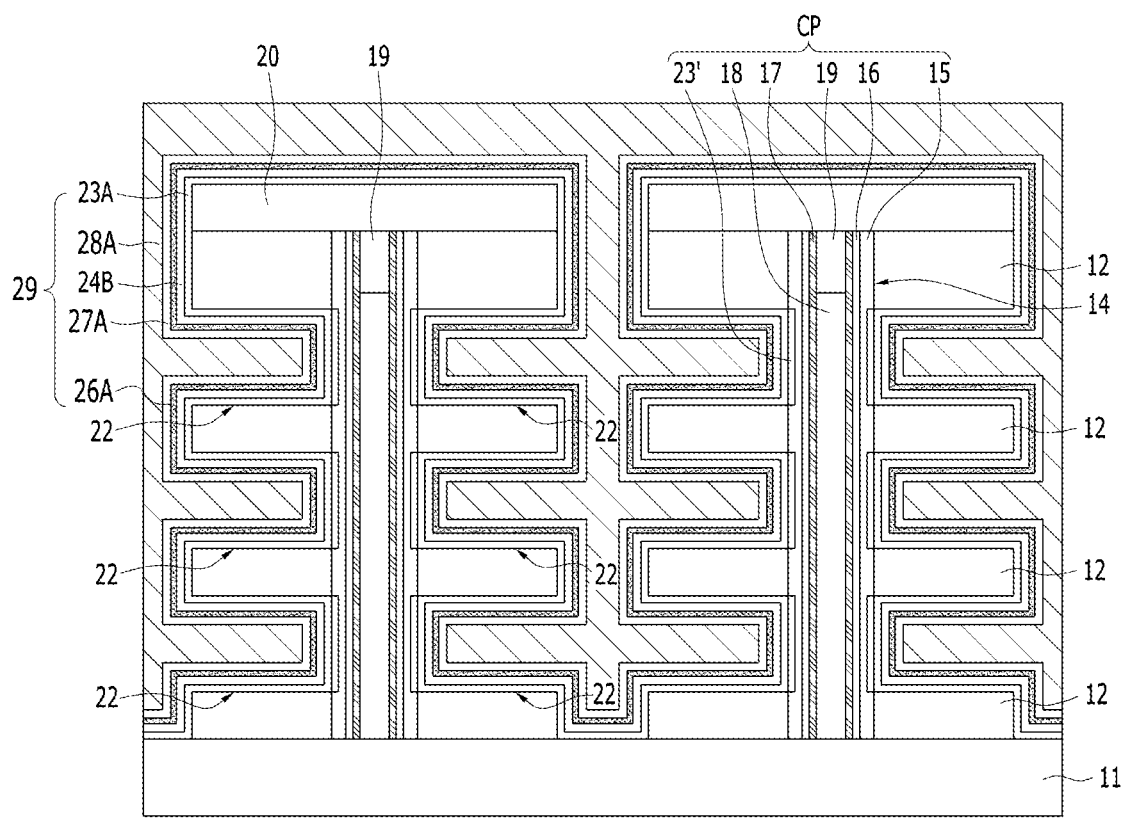

Referring to FIG. 10H, a second barrier material 27A may be formed. The second barrier material 27A may include titanium nitride.

By forming the second barrier material 27A, it is possible to form an interface control material, that is, an interface control material formed of a stack of the first barrier material 24B, the interface material 26A, and the second barrier material 27A. The stack of the first barrier material 24B, the interface material 26A, and the second barrier material 27A may include a TiN/TiON/TiN stack.

A conductive material 28A may be formed over the second barrier material 27A. The conductive material 28A may completely fill the horizontal recesses 22. The conductive material 28A may be formed by a Chemical Vapor Deposition (CVD) process or an Atomic Layer Deposition (ALD) process. The conductive material 28A may include a tungsten layer. The conductive material 28A may be deposited by using a gas containing tungsten and fluorine as a tungsten source gas and using a hydrogen containing gas as a reaction gas. The tungsten source gas may include tungsten hexafluoride ($WF_6$). The deposition process of the tungsten layer as the conductive material 28A may be performed in the order of a tungsten nucleation layer forming process and a tungsten bulk layer forming process.

When the tungsten layer is deposited as the conductive material 28A, a portion of the interface control material, for example, a portion of the second barrier material 27A, may be etched by a by-product gas present in the deposition process. For example, as described above, hydrogen may react with fluorine in a deposition process to create hydrofluoric gas, which is an etchant. When the interface control material is formed of a TiN/TiON/TiN stack, the amount of etching may increase. As the etch amount increases, the thickness of a tungsten bulk layer that fills the horizontal recesses 22 may be increased. Also, when the TiN/TiON/TiN stack is formed as the interface control material, the grain size of the tungsten bulk layer may be increased. As such, when the thickness of the tungsten bulk layer is increased and the grain size of the tungsten bulk layer is increased, the sheet resistance of the conductive material 28A may be improved.

The horizontal recesses 22 may be filled with a gap-fill material 29 comprising a stack of the first blocking material 23A, the first barrier material 24B, the interface material 26A, the second barrier material 27A, and the conductive material 28A.

Figure 10I:
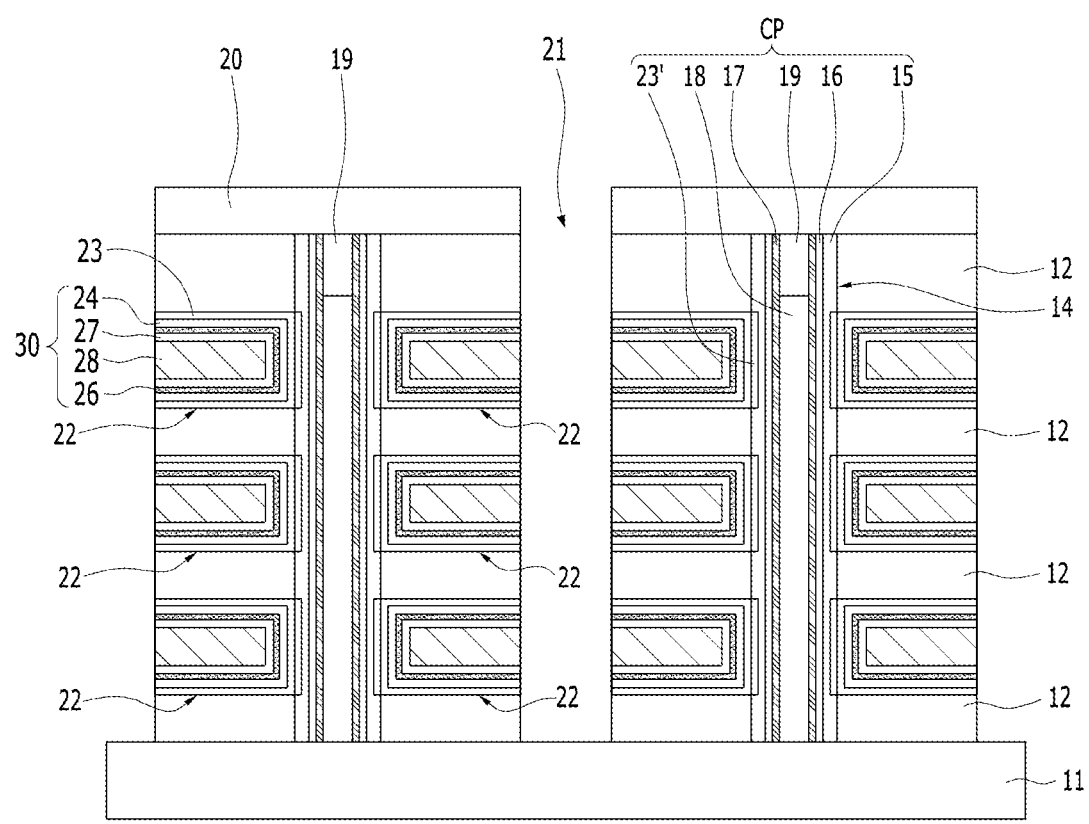

Referring to FIG. 10I, a gate structure 30 may be formed. In order to form the gate structure 30, the gap-fill material 29 may be selectively etched. For example, the first blocking material 23A, the first barrier material 24B, the interface material 26A, the second barrier material 27A, and the conductive material 28A may be selectively etched, and this may be called a 'gate isolation process'.

The gap-fill material 29 may be etched to expose the top surface of the capping layer 20 and the sidewalls of the slit 21. By the selective etch process of the gap-fill material 29, the gate structure 30 may be formed in the horizontal recess 22. The surface of the horizontal recess 22 may be covered with the first blocking layer 23. The first blocking layer 23 may be formed by etching the first blocking material 23A. The gate structure 30 may fill the horizontal recess 22 over the first blocking layer 23. The gate structure 30 may include a first barrier layer 24, an interface layer 26, a second barrier layer 27, and a gate electrode 28. The first barrier layer 24 may be formed by selectively etching the first barrier material 24B.

The interface layer 26 may be formed by selectively etching the interface material 26A, and the second barrier layer 27 may be formed by selectively etching the second barrier material 27A. The gate electrode 28 may be formed by selectively etching the conductive material 28A. The selective etching process of the gap-fill material 29 may include an etch-back process. Thus, the gate structure 30 may be formed inside the horizontal recess 22. The first barrier layer 24, the interface layer 26, and the second barrier layer 27 may line the surface of the horizontal recess 22 over the first blocking layer 23. The gate electrode 28 may fill the horizontal recess 22. The gate electrode 28 may be formed without voids in the horizontal recess 22, and thus the gate structure 30 may be formed in the horizontal recess 22 without defects caused by fumes from the deposition process.

Since the first barrier layer 24, the interface layer 26 and the second barrier layer 27 are titanium nitride, titanium oxynitride and titanium nitride and the gate electrode 28 is tungsten, the gate structure 30 may be a TiN/TiON/TiN/W stack.

The gate structure 30 may have a shape surrounding the vertical channel structure CP. The gate structure 30 may be referred to as a horizontal gate electrode or a horizontal word line.

According to the embodiments described above, an interface control layer including the first barrier layer 24, the interface layer 26, and the second barrier layer 27 may be formed.

When the interface control layer is formed, it is possible to block the infiltration of fluorine, which is a by-product generated in the subsequent process of depositing a tungsten layer by forming the interface material 26A by the oxidation process 25. Accordingly, the attack of the first blocking material 23A may be prevented.

Also, since the interface material 26A is formed by the oxidation process 25, the dielectric constant of the interface control layer may be improved. As a result, back tunneling of idle electrons may be prevented in the interface control layer to improve an erase saturation threshold voltage (Erase Sat Vt).

In addition, since the TiN/TiON/TiN or TiON/TiN stack has TiN whose grain size is significantly reduced to be smaller than that of a TiN single layer, the grain size of the subsequent tungsten layer may be relatively increased. As a result, the resistance of the gate electrode 28 may be improved, and the program speed may be increased.

According to the embodiments of the present disclosure, since the thickness of a barrier layer is not increased, the resistance of a gate electrode may be lowered, and the dielectric constant may be secured by an interface layer.

According to the embodiments of the present disclosure, a gate electrode may be realized to have high dielectric properties and low resistance even when the number of vertical semiconductor devices increases.

According to the embodiments of the present disclosure, the resistance of a barrier layer and a gate electrode may be improved simultaneously by increasing the grain size of the gate electrode. Also, the reliability of memory cells may be improved by preventing deterioration of underlying materials due to an etch material accompanied by the deposition of the gate electrode.

While the present disclosure has been described with respect to the specific embodiments, it will be apparent to those skilled in the art that various changes and modifications may be made without departing from the spirit and scope of the disclosure as defined in the following claims.

What is claimed is:

1. A semiconductor device, comprising:
   a stack structure including a plurality of horizontal recesses vertically spaced apart from each other;
   a blocking layer lining the horizontal recesses;
   an interface control layer that covers the blocking layer, the interface control layer including a conductive barrier element and a dielectric barrier element;
   an interface compound layer disposed between the interface control layer and the blocking layer; and
   a gate electrode filled within the horizontal recesses and over the interface control layer,
   wherein the blocking layer comprises:
   a silicon oxide layer;
   an aluminum oxide layer; and
   an interface enhancement layer between the silicon oxide layer and the aluminum oxide layer.

2. The semiconductor device of claim 1, wherein the interface control layer includes:
   a dielectric barrier layer in contact with the blocking layer; and
   a conductive barrier layer formed over the dielectric barrier layer.

3. The semiconductor device of claim 1, wherein the interface control layer includes:
   a dielectric barrier layer in contact with the blocking layer and having a plurality of layers with different oxygen contents; and
   a conductive barrier layer formed over the dielectric barrier layer.

4. The semiconductor device of claim 1, wherein the interface control layer includes:
   a first conductive barrier layer in contact with the blocking layer;
   a dielectric barrier layer over the first conductive barrier layer; and
   a second conductive barrier layer disposed over the dielectric barrier layer.

5. The semiconductor device of claim 4, wherein the dielectric barrier layer includes an oxide of a material of the first conductive barrier layer.

6. The semiconductor device of claim 1, wherein the interface control layer includes:
   a first conductive barrier layer in contact with the blocking layer;
   a dielectric barrier layer having a multi-layer liner structure formed over the first conductive barrier layer; and
   a second conductive barrier layer formed over the dielectric barrier layer.

7. The semiconductor device of claim 1, wherein the conductive barrier element includes a metal nitride, and the dielectric barrier element includes an oxide of the metal nitride.

8. The semiconductor device of claim 1, wherein the conductive barrier element includes titanium nitride, and the dielectric barrier element includes titanium oxynitride.

9. The semiconductor device of claim 1, wherein the interface control layer includes a stack of titanium oxynitride and titanium nitride.

10. The semiconductor device of claim 1, wherein the interface control layer includes a stack in which a layer of titanium oxynitride is interposed between two titanium nitride layers.

11. The semiconductor device of claim 1, wherein the interface control layer includes a fluorine blocking material.

12. The semiconductor device of claim 1, wherein the gate electrode includes tungsten deposited using a tungsten hexafluoride gas.

13. The semiconductor device of claim 1, wherein the stack structure further includes dielectric layers, and the gate structures and the dielectric layers are alternately stacked.

14. The semiconductor device of claim 13, further comprising:
    a vertical channel structure that penetrates the gate electrodes and the dielectric layer patterns.

15. The semiconductor device of claim 1, wherein the interface compound layer has a higher dielectric constant and a greater work function than the blocking layer.

16. A semiconductor device, comprising:
    a stack structure including a plurality of horizontal recesses vertically spaced apart from each other;
    a blocking layer lining the horizontal recesses;
    an interface control layer that covers the blocking layer, the interface control layer including a conductive barrier element and a dielectric barrier element;
    an interface compound layer disposed between the interface control layer and the blocking layer; and
    a gate electrode filled within the horizontal recesses and over the interface control layer,
    wherein the blocking layer comprises:
    a silicon oxide layer;
    an aluminum oxide layer; and
    an interface enhancement layer disposed between the silicon oxide layer and the aluminum oxide layer.

17. A semiconductor device, comprising:
    a stack structure including a plurality of horizontal recesses vertically spaced apart from each other;
    a blocking layer lining the horizontal recesses;
    an interface control layer that covers the blocking layer, the interface control layer including a conductive barrier element and a dielectric barrier element;
    an interface compound layer disposed between the interface control layer and the blocking layer; and
    a gate electrode filled within the horizontal recesses and over the interface control layer,
    wherein the interface control layer comprises:
    a first titanium nitride layer;
    a second titanium nitride layer; and a titanium oxynitride layer disposed between the first titanium nitride layer and the second titanium nitride layer,
wherein the blocking layer includes aluminum oxide, and the interface compound layer includes AlTiON or AlTiO.

* * * * *